(12) United States Patent
Lee et al.

(10) Patent No.: US 8,252,639 B2
(45) Date of Patent: Aug. 28, 2012

(54) THIN FILM TRANSISTOR ARRAY PANEL AND METHOD FOR MANUFACTURING THE SAME

(75) Inventors: Je-Hun Lee, Seoul (KR); Beom-Seok Cho, Seoul (KR); Chang-Oh Jeong, Suwon-si (KR); Joo-Han Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/951,981

(22) Filed: Nov. 22, 2010

(65) Prior Publication Data

US 2011/0065220 A1 Mar. 17, 2011

Related U.S. Application Data

(62) Division of application No. 11/215,067, filed on Aug. 29, 2005, now Pat. No. 7,858,982.

(30) Foreign Application Priority Data

Sep. 24, 2004 (KR) .................. 10-2004-0077519

(51) Int. Cl.
*H01L 21/00* (2006.01)

(52) U.S. Cl. ........ 438/158; 438/149; 438/151; 438/161; 438/164; 438/585; 438/586; 438/597; 438/653

(58) Field of Classification Search .................. 438/149, 438/151, 158, 162, 161, 164, 585, 586, 597, 438/653
See application file for complete search history.

(56) References Cited

U.S. PATENT DOCUMENTS

| | | | |
|---|---|---|---|
| 5,311,040 A | | 5/1994 | Hiramatsu et al. |
| 5,994,721 A | * | 11/1999 | Zhong et al. .................. 257/89 |
| 6,064,091 A | | 5/2000 | Deane et al. |
| 6,524,958 B2 | | 2/2003 | Sakai et al. |
| 6,956,236 B1 | | 10/2005 | Sasaki et al. |
| 7,102,718 B1 | | 9/2006 | Yamazaki et al. |
| 7,138,655 B2 | | 11/2006 | Tak et al. |
| 2002/0033927 A1 | | 3/2002 | Mun et al. |
| 2002/0142567 A1 | | 10/2002 | Hagino et al. |
| 2003/0148565 A1 | | 8/2003 | Yamanaka |
| 2004/0056251 A1 | | 3/2004 | Kim et al. |
| 2004/0099865 A1 | | 5/2004 | Tak et al. |
| 2004/0203181 A1 | | 10/2004 | Shang et al. |

FOREIGN PATENT DOCUMENTS

| | | |
|---|---|---|
| JP | 59-213169 | 12/1984 |
| JP | 02-062077 | 3/1990 |
| JP | 03-114234 | 5/1991 |
| JP | 06-163901 | 6/1994 |
| JP | 11-121761 | 4/1999 |
| JP | 2002-305306 | 10/2002 |
| JP | 2002-373891 | 12/2002 |
| KR | 10-1997-0018707 | 4/1997 |

(Continued)

*Primary Examiner* — Jay C Kim
(74) *Attorney, Agent, or Firm* — Innovation Counsel LLP

(57) ABSTRACT

The present invention provides a thin film transistor array panel comprising: an insulating substrate; a gate line formed on the insulating substrate and having a gate electrode; a gate insulating layer formed on the gate line; a semiconductor formed on the gate insulating layer and overlapping the gate electrode; diffusion barriers formed on the semiconductor and containing nitrogen; a data line crossing the gate line and having a source electrode partially contacting the diffusion barriers; a drain electrode partially contacting the diffusion barriers and facing the source electrode on the gate electrode; and a pixel electrode electrically connected to the drain electrode.

5 Claims, 31 Drawing Sheets

FOREIGN PATENT DOCUMENTS

| KR | 10-0272255 | B1 | 8/2000 |
| KR | 10-2002-0035747 | A | 5/2002 |
| KR | 1020020089625 | A | 11/2002 |
| KR | 10-2004-0059088 | A | 7/2004 |
| KR | 1020040063367 | A | 7/2004 |

* cited by examiner

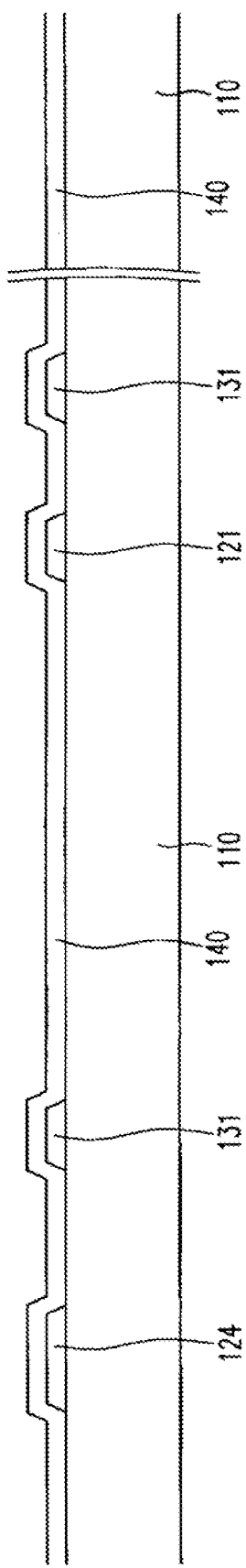

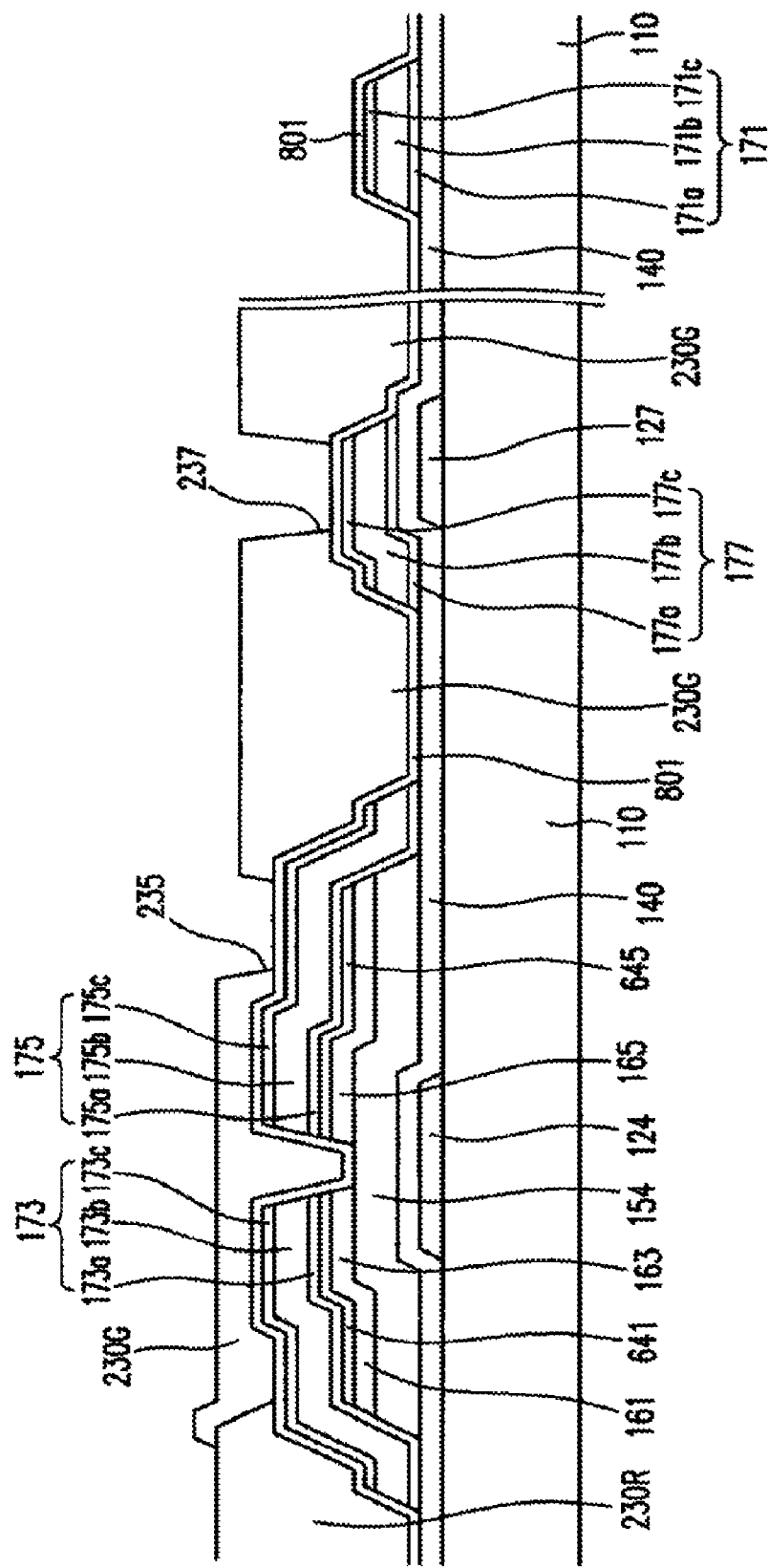

THIN FILM TRANSISTOR ARRAY PANEL AND METHOD FOR MANUFACTURING THE SAME

CROSS-REFERENCE TO RELATED APPLICATION

This application is a divisional of U.S. patent application Ser. No. 11/215,067 filed on Aug. 29, 2005 now U.S. Pat. No. 7,858,982 which claims priority to and the benefit of Korean Patent Application No. 10-2004-0077519 filed in the Korean Intellectual Property Office on Sep. 24, 2004, the entire contents of which are incorporated herein by reference.

BACKGROUND OF THE INVENTION (a) Field of the Invention

The present description relates to a thin film transistor (TFT) array panel and a manufacturing method of the same.

(b) Description of the Related Art

Liquid crystal displays (LCDs) are one of the most widely used flat panel displays. An LCD includes a liquid crystal (LC) layer interposed between two panels provided with field-generating electrodes. The LCD displays images by applying voltages to the field-generating electrodes to generate an electric field in the LC layer, which determines orientations of LC molecules in the LC layer to adjust polarization of incident light.

An LCD including two panels respectively provided with field-generating electrodes, wherein one panel has a plurality of pixel electrodes in a matrix and the other has a common electrode covering the entire surface of the panel, dominates the LCD market.

The LCD can display images by applying a different voltage to each pixel electrode. For this purpose, thin film transistors having three terminals to switch voltages applied to pixel electrodes are connected to the pixel electrodes and gate lines to transmit signals for controlling thin film transistors, and data lines to transmit voltages applied to pixel electrodes are formed on a thin film transistor (TFT) array panel.

The gate lines and data lines of the TFT array panel preferably comprise a conductive material having low resistivity such as aluminum (Al) or an Al alloy to reduce signal delay. However, Al is vulnerable to a chemical or physical attack and has a bad contact characteristic with indium tin oxide (ITO). Accordingly, the gate lines and data lines are formed to have double or triple layers including Al or an Al alloy layer and another metal layer having a good contact characteristic with ITO and strong resistance to a chemical or physical attack. Molybdenum (Mo) is one of such metals having a good contact characteristic with ITO and strong resistance to a chemical or physical attack. A Mo-containing layer is useful in the formation of signal lines along with an Al-containing layer because the Mo-containing layer and the Al-containing layer can be simultaneously patterned by etching.

However, when data lines and drain electrodes include the Mo-containing layer, an off current of the TFTs is increased, thereby degrading the image quality of an LCD.

SUMMARY

It is an object of the present invention to provide a TFT array panel having minimal leakage current for enhancing image quality of a display.

The present invention provides a thin film transistor array panel comprising: an insulating substrate; a gate line formed on the insulating substrate and comprising a gate electrode; a gate insulating layer formed on the gate line; a semiconductor layer formed on the gate insulating layer and overlapping the gate electrode; diffusion barriers formed on the semiconductor layer and containing nitrogen; a data line crossing the gate line and comprising a source electrode partially contacting the diffusion barriers; a drain electrode partially contacting the diffusion barriers and facing the source electrode on the gate electrode; and a pixel electrode electrically connected to the drain electrode.

The thin film transistor array panel may further comprise ohmic contacts disposed between the semiconductor layer and the diffusion barriers.

The diffusion barriers may have a substantially same planar pattern as the ohmic contacts.

The diffusion barriers may be made of a material comprising the ohmic contact material and nitrogen.

The data line may comprise first to third conductor layers, the first and third conductor layers comprising Mo or a Mo alloy, and the second layer comprising Al or an Al alloy.

The thin film transistor array panel may further comprise color filters formed between the pixel electrode and the data line and the drain electrode.

The thin film transistor array panel may further comprise a passivation layer formed between the pixel electrode and the color filters.

The thin film transistor array panel may further comprise an interlayer insulating layer formed between the color filters and the data line, drain electrode, and semiconductor layer.

The pixel electrode may have a plurality of cutouts partitioning a pixel area into a plurality of domains.

The diffusion barriers may have a thickness between 10 Å and 100 Å.

The present invention provide a manufacturing method of a thin film transistor array panel comprising: forming a gate line on an insulating substrate; depositing a gate insulating layer and a first a-Si layer in sequence; depositing a second a-Si layer doped with a conductive impurity and including nitrogen on the first a-Si layer; patterning the second a-Si layer and the first a-Si layer to form a pre-diffusion barrier and a semiconductor layer; forming a data line and a drain electrode partially overlapping the pre-diffusion barrier; etching the pre-diffusion barrier exposed between the data line and the drain electrode to form diffusion barriers; and forming a pixel electrode electrically connected to the drain electrode.

The method may further comprise a step of depositing a third a-Si layer doped with a conductive impurity before depositing the second a-Si layer.

The second a-Si layer may be etched along with the first a-Si layer and the third a-Si layer in the steps of patterning the second and the first a-Si layers and etching the pre-diffusion barrier exposed between the data line and the drain electrode to form ohmic contacts.

The data line and the drain electrode comprise first to third conductor layers, the first and third conductor layers comprising Mo or a Mo alloy, and the second layer comprising Al or an Al alloy.

The second a-Si layer may be deposited with the same deposition conditions as the third a-Si layer with the addition of a gas containing nitrogen.

The gas containing nitrogen may be one of $N_2$, $NH_3$, and a mixture of $N_2$ and $NH_3$.

The method may further comprise a step of forming color filters before forming the pixel electrode.

BRIEF DESCRIPTION OF THE DRAWINGS

FIG. 9B is a sectional view of the TFT array panel shown in FIG. 9A taken along the line IXb-IXb';

FIG. 13B is a sectional view of the TFT array panel shown in FIG. 13A taken along the line XIIIB-XIIIB';

FIG. 16B is a sectional view of the TFT array panel shown in FIG. 16A taken along the line XVIb-XVIb'-XVIb'';

DETAILED DESCRIPTION OF THE PREFERRED EMBODIMENTS

Figure 1:
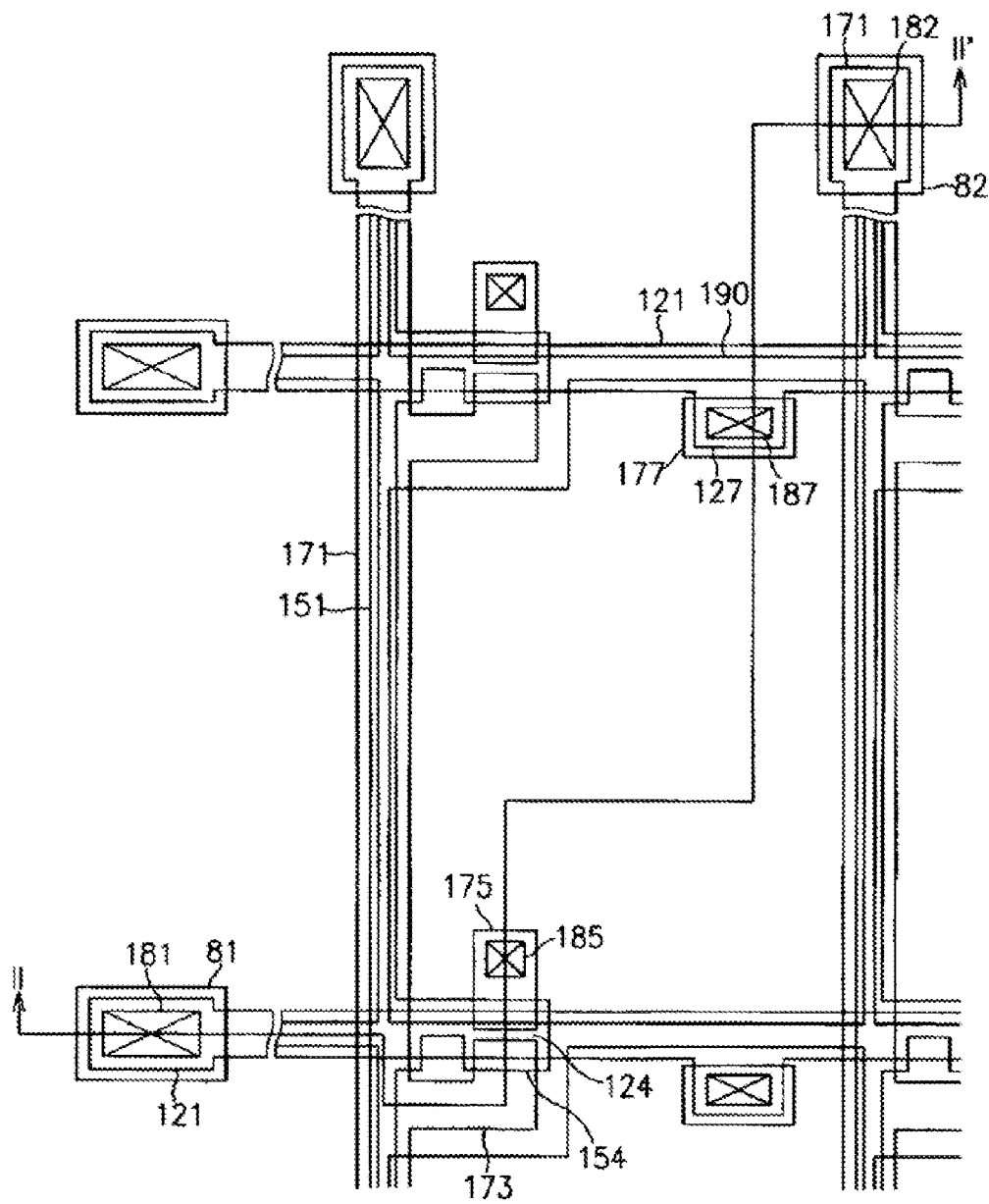
FIG. 1 is a layout view of a TFT array panel for an LCD according to an embodiment of the present invention.

Preferred embodiments of the present invention will be described more fully hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Now, TFT array panels and manufacturing methods thereof according to embodiments of this invention will be described in detail with reference to the accompanying drawings such that those of ordinary skill in the art can easily carry out the invention.

Embodiment 1

First, a TFT array panel for an LCD according to the first embodiment of the present invention will be described in detail with reference to FIGS. 1 and 2.

Figure 2:
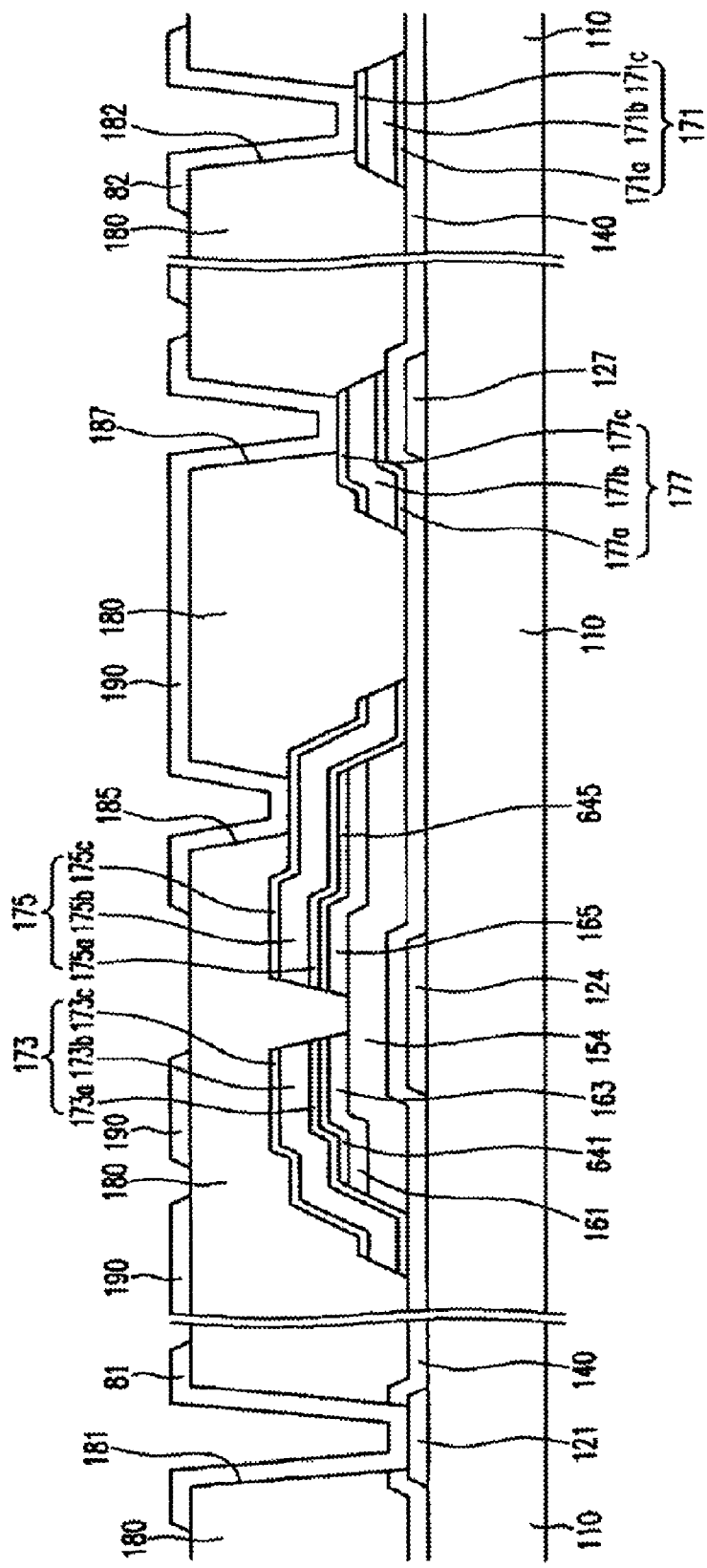
FIG. 2 is a sectional view of the TFT array panel shown in FIG. 1 taken along the line II-II.

FIG. 1 is a layout view of a TFT array panel for an LCD according to an embodiment of the present invention, and FIG. 2 is a sectional view of the TFT array panel shown in FIG. 1 taken along the line II-II'.

A plurality of gate lines 121 for transmitting gate signals are formed on an insulating substrate 110. The gate lines 121 are primarily formed in the horizontal direction, and partial portions thereof form a plurality of gate electrodes 124. Also, different partial portions of the gate lines 121 which extend in the lower direction form a plurality of expansions 127.

The gate lines 121 comprise an Al-containing metal such as Al and an Al alloy. The gate lines 121 may include two films having different physical characteristics, a lower film and an upper film. The upper film preferably comprises an Al-containing metal such as Al and an Al alloy for reducing signal delay or voltage drop in the gate lines 121. On the other hand, the lower film preferably comprises a material such as Cr, Mo, a Mo alloy such as MoW, Ta, and Ti, which have good physical, chemical, and electrical contact characteristics with other materials such as indium tin oxide (ITO) and indium zinc oxide (IZO). Good examples of a combination of the lower film material and the upper film material are a Mo and Al—Nd alloy and Mo and Al.

A gate insulating layer 140 preferably comprising silicon nitride (SiNx) is formed on the gate lines 121.

A plurality of semiconductor stripes 151 preferably comprising hydrogenated amorphous silicon (abbreviated to "a-Si") are formed on the gate insulating layer 140. Each semiconductor stripe 151 extends substantially in the longitudinal direction and is curved periodically. Each semiconductor stripe 151 has a plurality of projections 154 branched out toward the gate electrodes 124. The width of each semiconductor stripe 151 widens near the gate lines 121 such that the semiconductor stripe 151 covers large areas of the gate lines 121.

A plurality of ohmic contact stripes and islands 161 and 165 preferably comprising silicide or n+ hydrogenated a-Si heavily doped with an n-type impurity are formed on the semiconductor stripes 151. Each ohmic contact stripe 161 has a plurality of projections, and the projections 163 and the ohmic contact islands 165 are located in pairs on the projections 154 of the semiconductor stripes 151.

A plurality of diffusion barrier stripes 641 and islands 645 are formed on the ohmic contact stripes 161 and islands 165. The diffusion barrier stripes 641 and islands 645 preferably comprise silicide or n+ hydrogenated a-Si heavily doped with an n-type impurity, and they include nitrogen ($N_2$). Accordingly, the diffusion barrier stripes 641 and islands 645 comprise the same material as the ohmic contact stripes 161 and islands 165 except they include N. The diffusion barrier stripes 641 and islands 645 have the same planar pattern as the ohmic contact stripes 161 and islands 165.

The edge surfaces of the semiconductor stripes 151, the ohmic contacts 161 and 165, and the diffusion barrier 641 and 645 are tapered to enhance adhesion with an upper layer.

A plurality of data lines 171, a plurality of drain electrodes 175, and a plurality of storage capacitor conductors 177 are formed on the diffusion barrier 641 and 645 and the gate insulating layer 140.

The data lines 171 for transmitting data voltages extend substantially in the longitudinal direction and intersect the gate lines 121 to define pixel areas arranged in a matrix. A plurality of branches of each data line 171, which project toward the drain electrodes 175, form a plurality of source electrodes 173. Each pair of the source electrodes 173 and the drain electrodes 175 is separated from each other and opposite each other with respect to a gate electrode 124.

A gate electrode 124, a source electrode 173, and a drain electrode 175 along with a projection 154 of a semiconductor stripe 151 forms a TFT having a channel formed in the projection 154 disposed between the source electrode 173 and the drain electrode 175. The storage capacitor conductor 177 overlaps with the expansion 127 of the gate line 121.

The data line 171, the drain electrode 175, and the storage capacitor conductor 177 comprise first layers 171a, 175a, and 177a, second layers 171b, 175b, and 177b, and third layers 171c, 175c, and 177c, respectively. The first layers 171a, 175a, and 177a and the third layers 171c, 175c, and 177c are respectively disposed at lower and upper sides of the second layers 171b, 175b, and 177b. The second layers 171b, 175b, and 177b preferably comprise an Al-containing metal such as Al, which has low resistivity, to reduce signal delay and voltage drop. The first layers 171a, 175a, and 177a preferably comprise a metal for preventing diffusion of Al such as Ti, Ta, Cr, Mo, and their alloys. The third layers 171c, 175c, and 177c preferably comprise a metal having good physical, chemical, and electrical contact characteristics with IZO or ITO, such as Ti, Ta, Cr, Mo, and their alloys.

In the present embodiment, the first and third layers 171a, 171c, 175a, 175c, 177a, and 177c comprise Mo, and the second layers 171b, 175b, and 177b comprise Al.

The diffusion barrier stripes 641 and islands 645 and the ohmic contacts 161 and 165 are interposed between the semiconductor stripes 151 and the data lines 171 and between the drain electrodes 175 and the projections 154 of the semiconductor stripe 151. The diffusion barrier stripes 641 and islands 645 prevent metal particles of the data lines 171 and the drain electrodes 175 from diffusing into the semiconductor stripes 151. The diffusion barrier stripes 641 and islands 645 reduce contact resistance between the semiconductor stripes 151 and the data lines 171 and between the drain electrodes 175 and the projections 154 of the semiconductor stripe 151 along with the ohmic contacts 161 and 165. Here, the nitrogen in the diffusion barrier stripes 641 and islands 645 serves as an n-type impurity.

Figure 22:
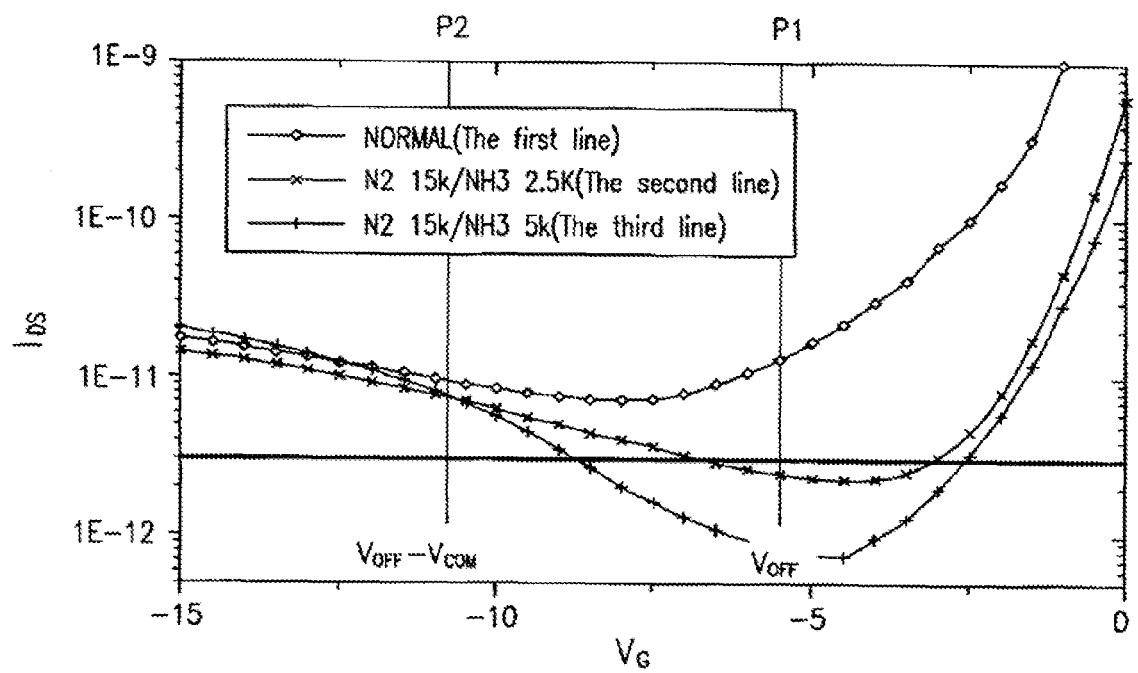
FIG. 22 is a graph showing $V_G$-Ids curves of TFTs without a diffusion barrier and with a diffusion barrier.

FIG. 22 illustrates the principle above. FIG. 22 is a graph showing $V_G$-Ids curves of TFTs without a diffusion barrier and with a diffusion barrier, where $V_G$ is the gate voltage and Ids is the drain current.

In FIG. 22, the first line is a $V_G$-Ids curve of a conventional TFT without a diffusion barrier. The second line is a $V_G$-Ids curve of a TFT having a diffusion barrier which is formed by injecting 15,000 sccm of $N_2$ and 2,500 sccm of $NH_3$. The third line is a $V_G$-Ids curve of a TFT having a diffusion barrier which is formed by injecting 15,000 sccm of $N_2$ and 5,000 sccm of $NH_3$.

Here, P1 is the off voltage (Voff) of the TFTs while the LCD is not driven. P2 is the off voltage of the TFTs while the LCD is driven. P2 is calculated by the equation P1-Vcom. Voff of the TFTs ranges between P1 and P2.

The first line is disposed at a higher position than the second and the third lines between P1 and P2. This means that the TFTs according to an embodiment of the present invention have smaller Ids than the conventional TFT.

The diffusion barrier does not affect Ion of a TFT, which is current when Von is applied to a gate electrode of the TFT.

The semiconductor stripe 151 is partially exposed at the place between the source electrode 173 and the drain electrode 175 and at the other places not covered with the data line 171 and the drain electrode 175. Most of the semiconductor stripe 151 is narrower than the data line 171, but the width of the semiconductor stripe 151 broadens near a place where the semiconductor stripe 151 and the gate line 121 meet each other in order to prevent disconnection of the data line 171, as mentioned above.

On the data line 171, the drain electrode 175, the storage capacitor conductor 177, and the exposed region of the semiconductor stripe 151, a passivation layer 180 is provided. The passivation layer 180 comprises an organic material having substantial planarization and photosensitive properties, or an insulating material with a low dielectric constant, such as a-Si:C:O, a Si:O:F, etc. This passivation layer 180 may be formed by plasma enhanced chemical vapor deposition (PECVD). To prevent the organic material of the passivation layer 180 from contacting the semiconductor stripes 151 exposed between the data line 171 and the drain electrode 175, the passivation layer 180 can be structured in such a way that an insulating layer comprising $SiN_x$ or $SiO_2$ is additionally formed under the organic material layer.

In the passivation layer 180, a plurality of contact holes 185, 187, and 182 are formed to expose the drain electrode 175, the storage capacitor conductor 177, and an end portion of the data line 171, respectively. The end portion of the data line 171 preferably has a wider width than the other portions of the data line 171.

A plurality of pixel electrodes 190 and a plurality of contact assistants 82, which may comprise IZO or ITO, are formed on the passivation layer 180.

Since the pixel electrode 190 is physically and electrically connected with the drain electrode 175 and the storage capacitor conductor 177 through the contact holes 185 and 187, respectively, the pixel electrode 190 receives the data voltage from the drain electrode 175 and transmits it to the storage capacitor conductor 177.

The pixel electrode 190 to which the data voltage is applied generates an electric field with a common electrode (not illustrated) of the opposite panel (not illustrated) to which a common voltage is applied, so that the liquid crystal molecules in the liquid crystal layer are rearranged.

Also, as mentioned above, the pixel electrode 190 and the common electrode form a capacitor to store and preserve the received voltage after the TFT is turned off. This capacitor will be referred to as a "liquid crystal capacitor." To enhance the voltage storage ability, another capacitor is provided, which is connected with the liquid crystal capacitor in parallel and will be referred to as a "storage capacitor." The storage capacitor is formed at an overlapping portion of the pixel electrode 190 and the adjacent gate line 121, which will be referred to as the "previous gate line." The expansion 127 of the gate line 121 is provided to ensure the largest possible overlap area and thus to increase storage capacity of the storage capacitor. The storage capacitor conductor 177 is connected to the pixel electrode 190 and overlaps the expansion 127, and is provided at the bottom of the passivation layer 180 so that the pixel electrode 190 is brought close to the previous gate line 121.

In some embodiments, pixel electrode 190 may overlap the adjacent gate line 121 and the adjacent data line 171 to enhance the aperture ratio.

The contact assistant 82 supplements adhesion between the end portion of the data line 171 and external devices, such as the driving integrated circuit, and protects them. Applying the contact assistant 82 is optional.

A method of manufacturing a TFT array panel will be now described in detail with reference to FIGS. 3A to 6B as well as FIGS. 1 and 2.

Figure 3A:
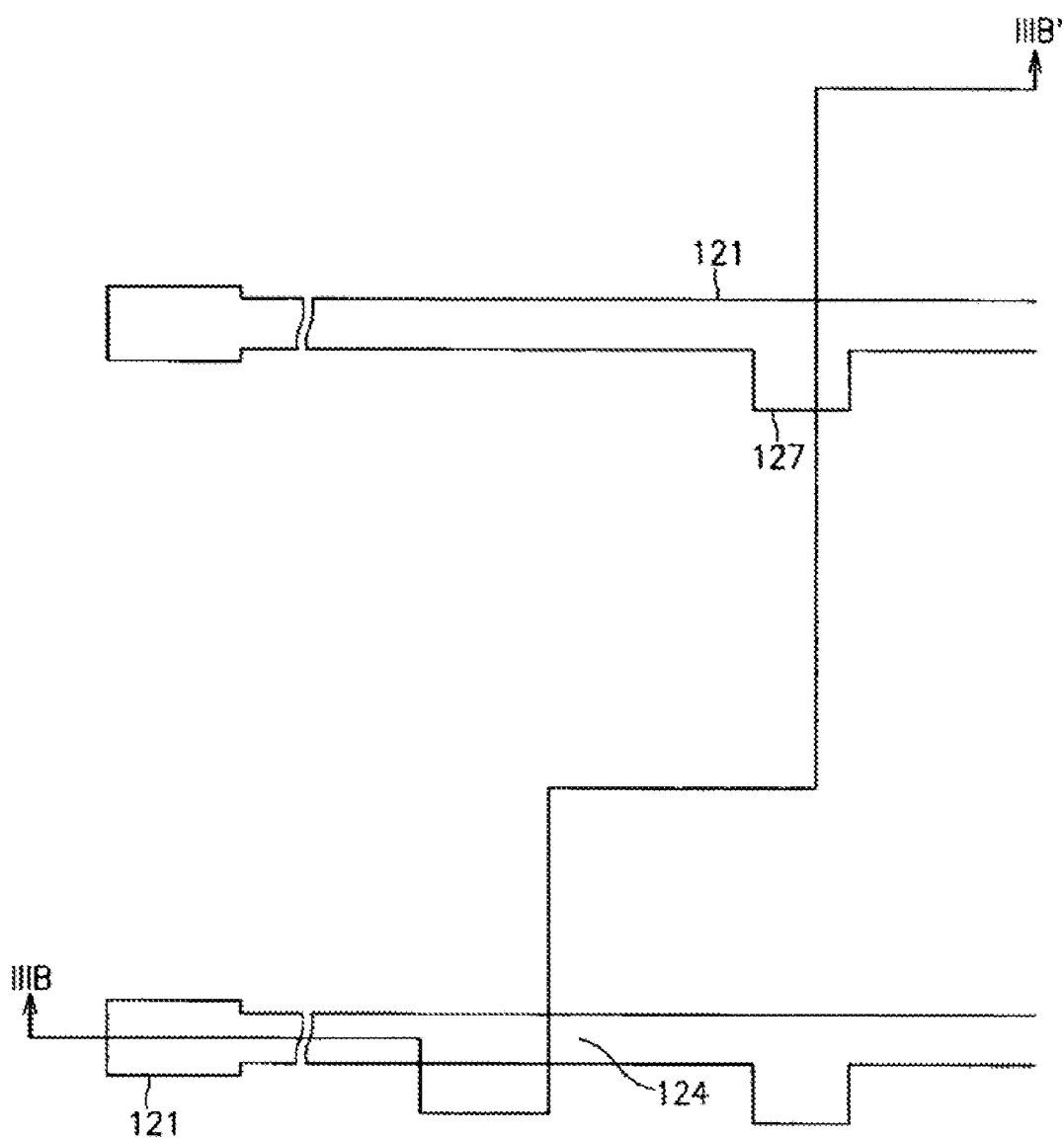
FIGS. 3A, 4A, 5A, and 6A are layout views sequentially illustrating the intermediate steps of a method of manufacturing a TFT array panel for an LCD according to the embodiment of FIGS. 1 and 2.
Figure 3B:
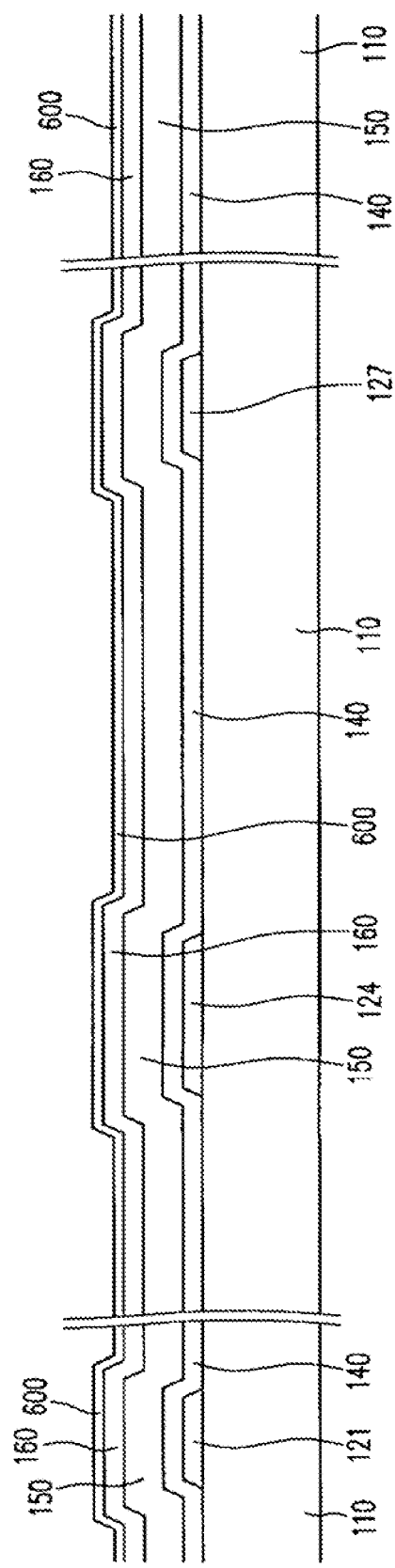
FIG. 3B is a sectional view of the TFT array panel shown in FIG. 3A taken along the line IIIb-IIIb'.

FIGS. 3A, 4A, 5A, and 6A are layout views sequentially illustrating the intermediate steps of a method of manufacturing a TFT array panel for an LCD according to the embodiment of FIGS. 1 and 2. FIG. 3B is a sectional view of the TFT array panel shown in FIG. 3A taken along the line IIIB-IIIB'. FIG. 4B is a sectional view of the TFT array panel shown in FIG. 4A taken along the line IVB-IVB' in the step following the step shown in FIG. 3B. FIG. 5B is a sectional view of the TFT array panel shown in FIG. 5A taken along the line VB-VB' in the step following the step shown in FIG. 4B. FIG. 6B is a sectional view of the TFT array panel shown in FIG. 6A taken along the line VIB-VIB' in the step following the step shown in FIG. 5B.

At first, as shown in FIG. 3B, a metal layer is formed on an insulating substrate 110 using a method such as sputtering and is photo-etched to form gate lines 121 having gate electrodes 124.

A gate insulating layer 140 and first to third a-Si layers 150, 160, and 600 are sequentially deposited on the gate lines 121. The first a-Si layer 150 comprises intrinsic amorphous silicon. The second a-Si layer 160 comprises extrinsic amorphous silicon. The third a-Si layer 600 comprises extrinsic amorphous silicon containing nitrogen.

The gate insulating layer 140 preferably comprises silicon nitride with a thickness of about 2,000 Å to about 5,000 Å.

The first to third a-Si layers 150, 160, and 600 may be deposited in a chamber by an in-situ method. After forming the first a-Si layer 150, the second a-Si layer 160 is formed by deposition while adding n-type impurities. Then, the third a-Si layer 600 is formed by deposition while adding n-type impurities and one or both of $NH_3$ and $N_2$ gas. Here, the thickness of the third a-Si layer 600 can be controlled by differentiating injecting time and the power of nitrogen gas. The third a-Si layer 600 preferably has a thickness between 10 Å to 100 Å.

The first a-Si layer 150 has a thickness of about 2,000 Å and forms a channel of a TFT. The second a-Si layer 160 has a thickness of about 500 Å and reduces contact resistance between the first a-Si layer 150 and an upper conductor layer. The third a-Si layer has a thickness between 10 Å to 100 Å and prevents metal particles from diffusing from the upper conductor layer to the first a-Si layer 150.

Figure 4A:
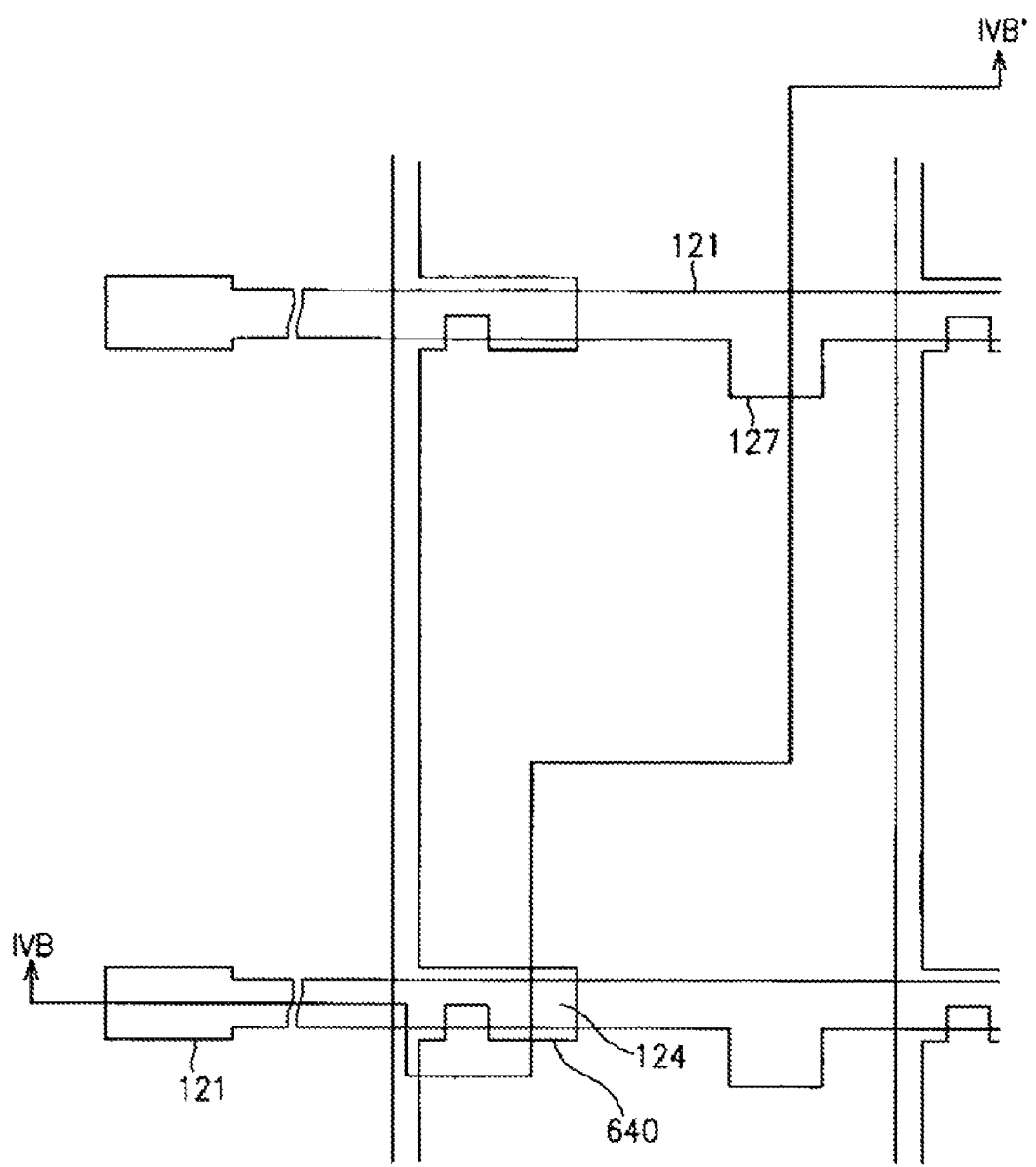
Figure 4B:
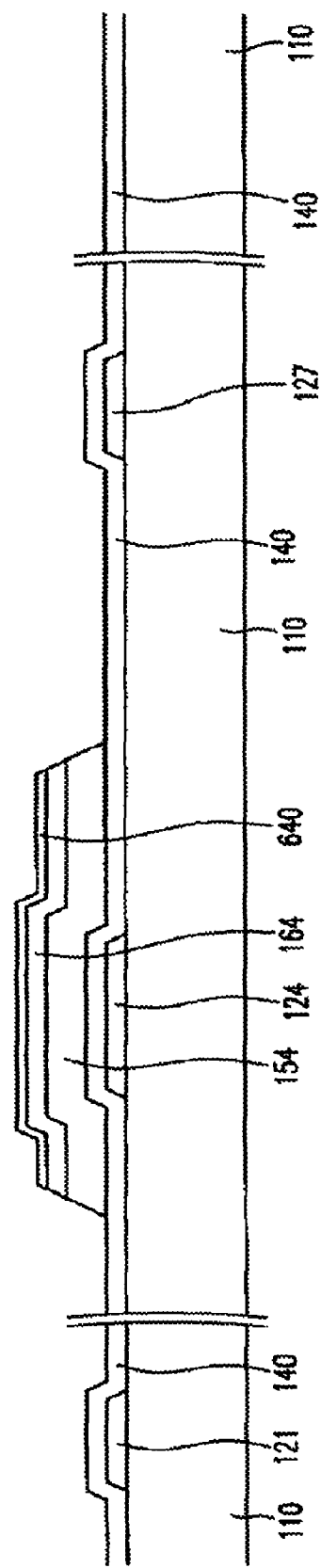
FIG. 4B is a sectional view of the TFT array panel shown in FIG. 4A taken along the line IVb-IVb' in the step following the step shown in FIG. 3B.

Referring to FIGS. 4A and 4B, the first to third a-Si layers are photo-etched to form a plurality of diffusion barrier patterns 640, a plurality of extrinsic semiconductor patterns 164, and a plurality of intrinsic semiconductor stripes 151 having projections 154.

Figure 5A:
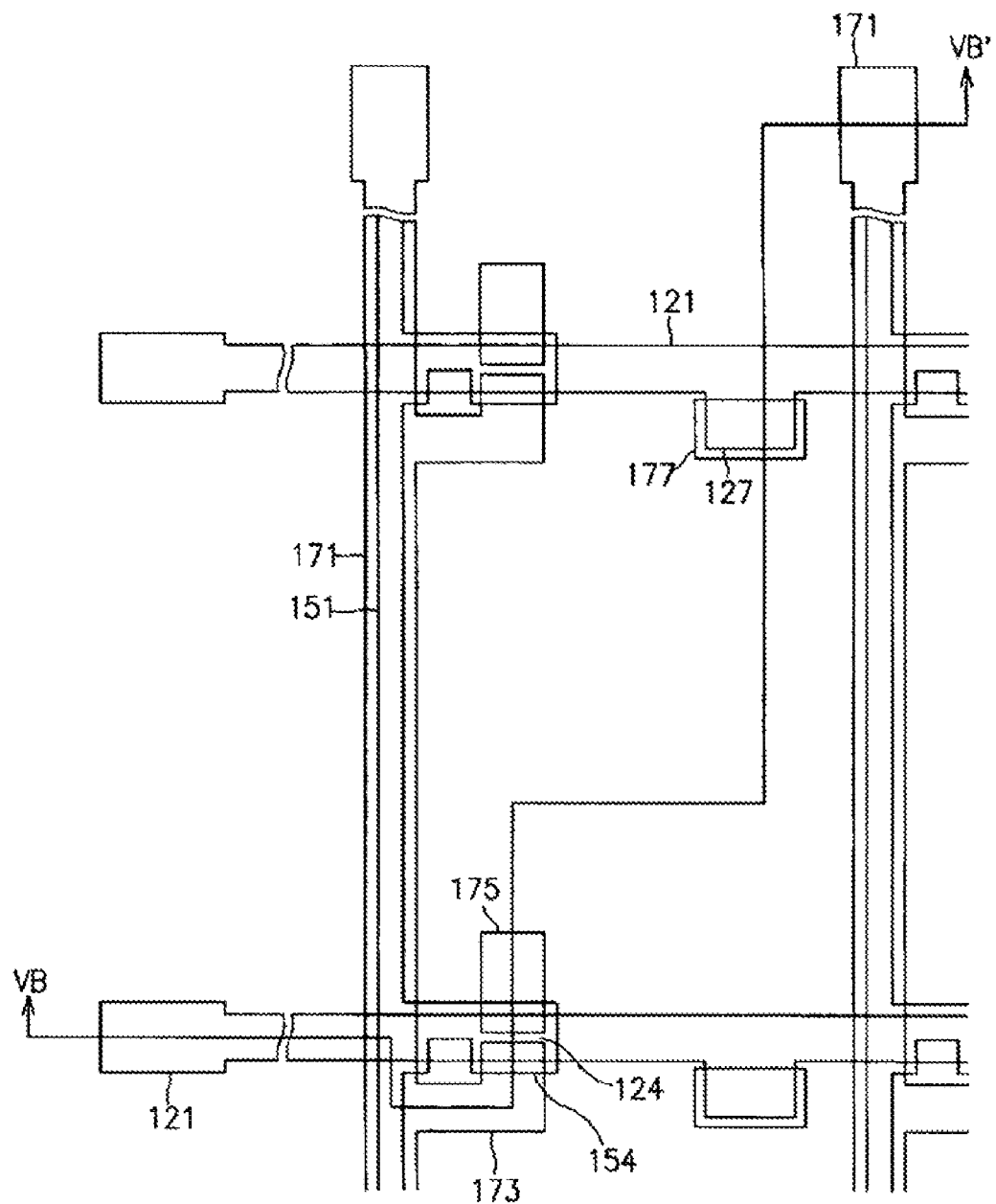
Figure 5B:
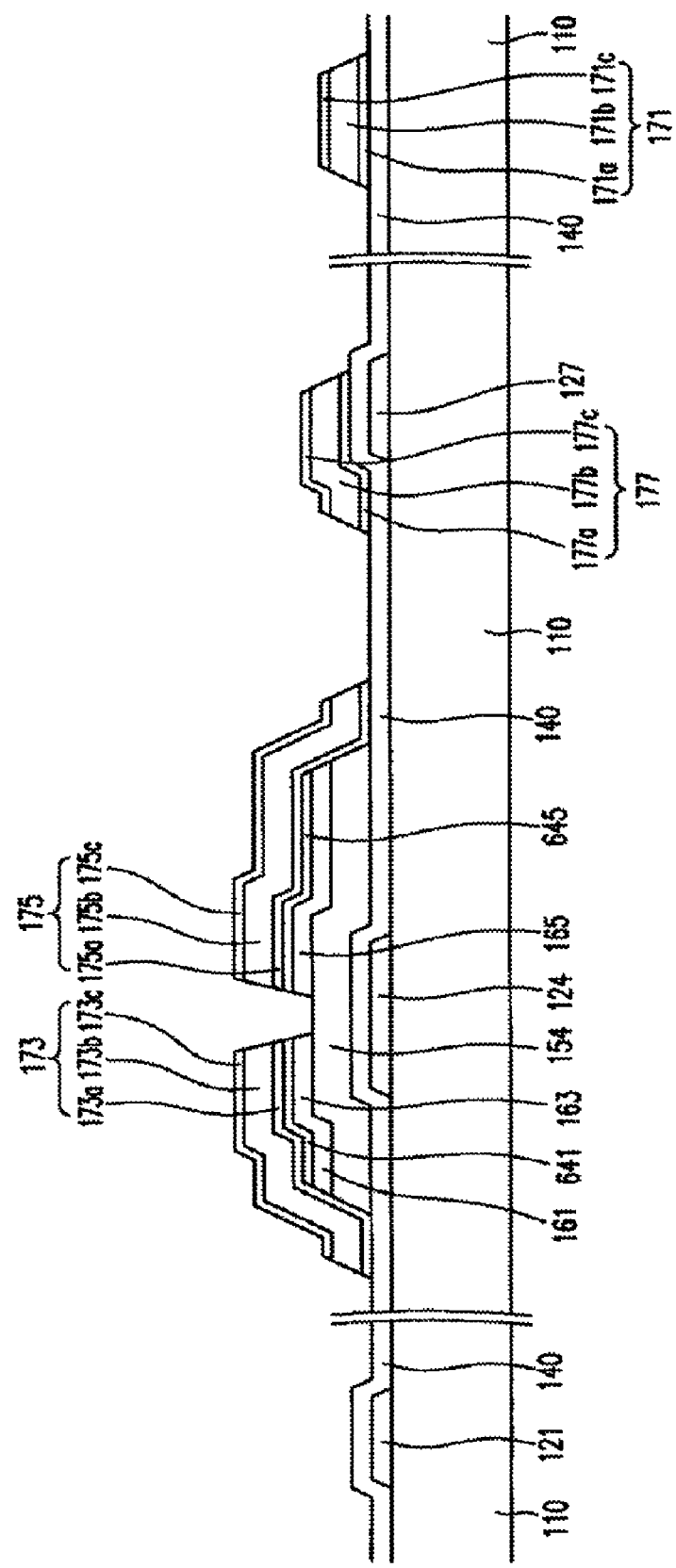
FIG. 5B is a sectional view of the TFT array panel shown in FIG. 5A taken along the line Vb-Vb' in the step following the step shown in FIG. 4B.

Next, as shown in FIGS. 5A and 5B, a data conductor layer is deposited on the diffusion barrier pattern 640 by a method such as sputtering. The data conductor layer preferably has triple metal layers including an Al-containing layer. Mo, Al, and Mo triple layers are good example.

When the data conductor layers include a Mo-containing layer and an Al-containing layer, the Mo-containing layer and the Al-containing layer can be simultaneously patterned by an etching condition.

The triple layers are patterned to form data lines 171, drain electrodes 175, and storage conductors 177 by photo-etching.

Next, portions of the diffusion barrier pattern 640 and the extrinsic semiconductor pattern 164, which are not covered with the data lines 171 and the drain electrodes 175, are removed by etching to complete a plurality of diffusion barriers 641 and 645 and ohmic contacts 161 and 165 and to expose portions of the intrinsic semiconductor stripes 151. Oxygen plasma treatment may follow thereafter in order to stabilize the exposed surfaces of the semiconductor stripes 151.

By forming diffusion barriers 641 and 645, diffusion of metal particles toward the semiconductor stripes 151 may be prevented. Accordingly, current leakage is minimized.

Since the Mo in the data lines 171 has a strong tendency to separate from nitrogen, which is contained in the diffusion barriers 641 and 645, Mo cannot pass the diffusion barriers 641 and 645. Accordingly, current leakage due to permeation of Mo into the semiconductor stripes 151 may be prevented.

Nitrogen of the diffusion barrier stripes 641 and islands 645 serves as an n-type impurity by reducing contact resistance between the data lines 171 and the intrinsic semiconductor stripe 151.

Figure 6A:
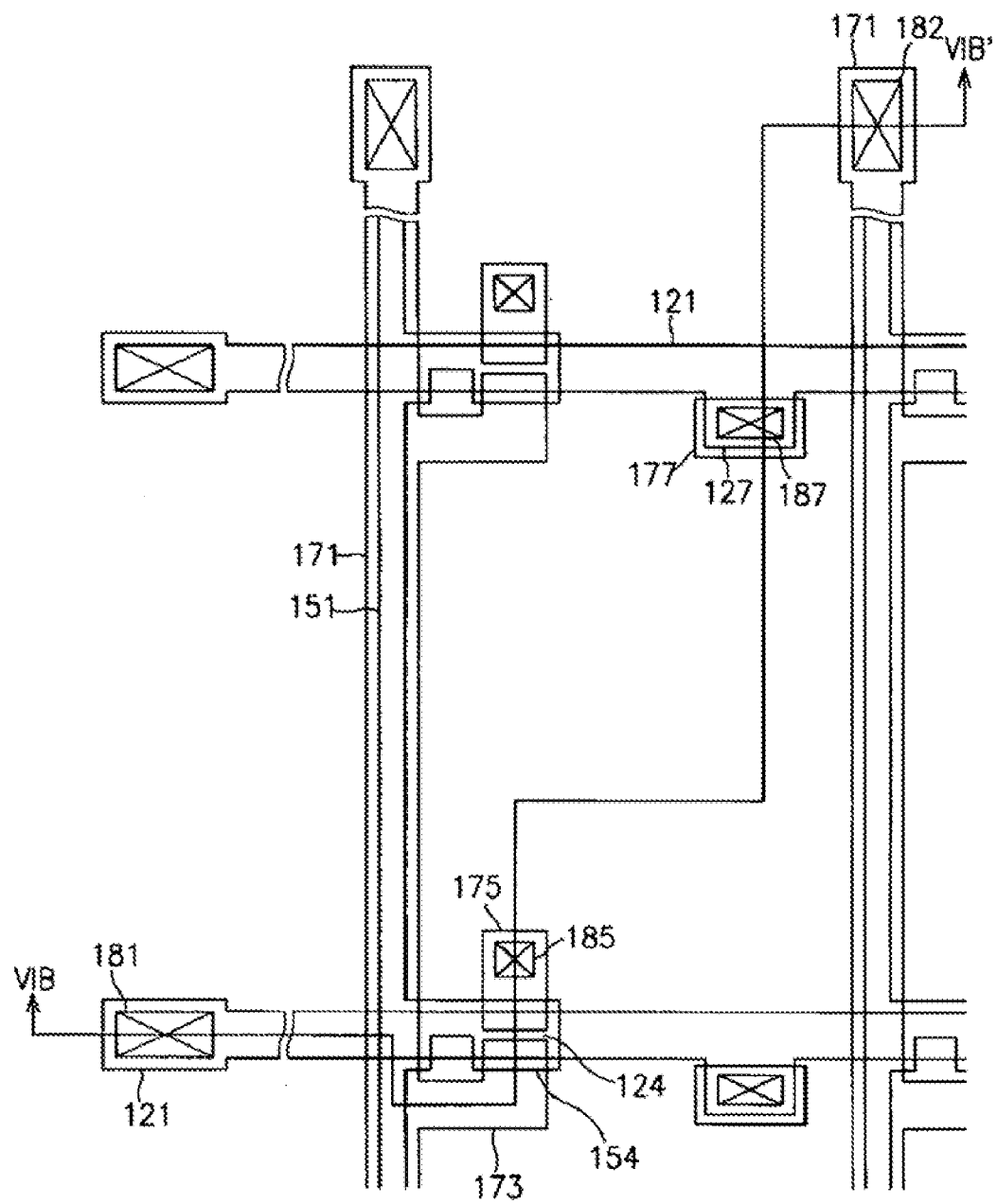
Figure 6B:
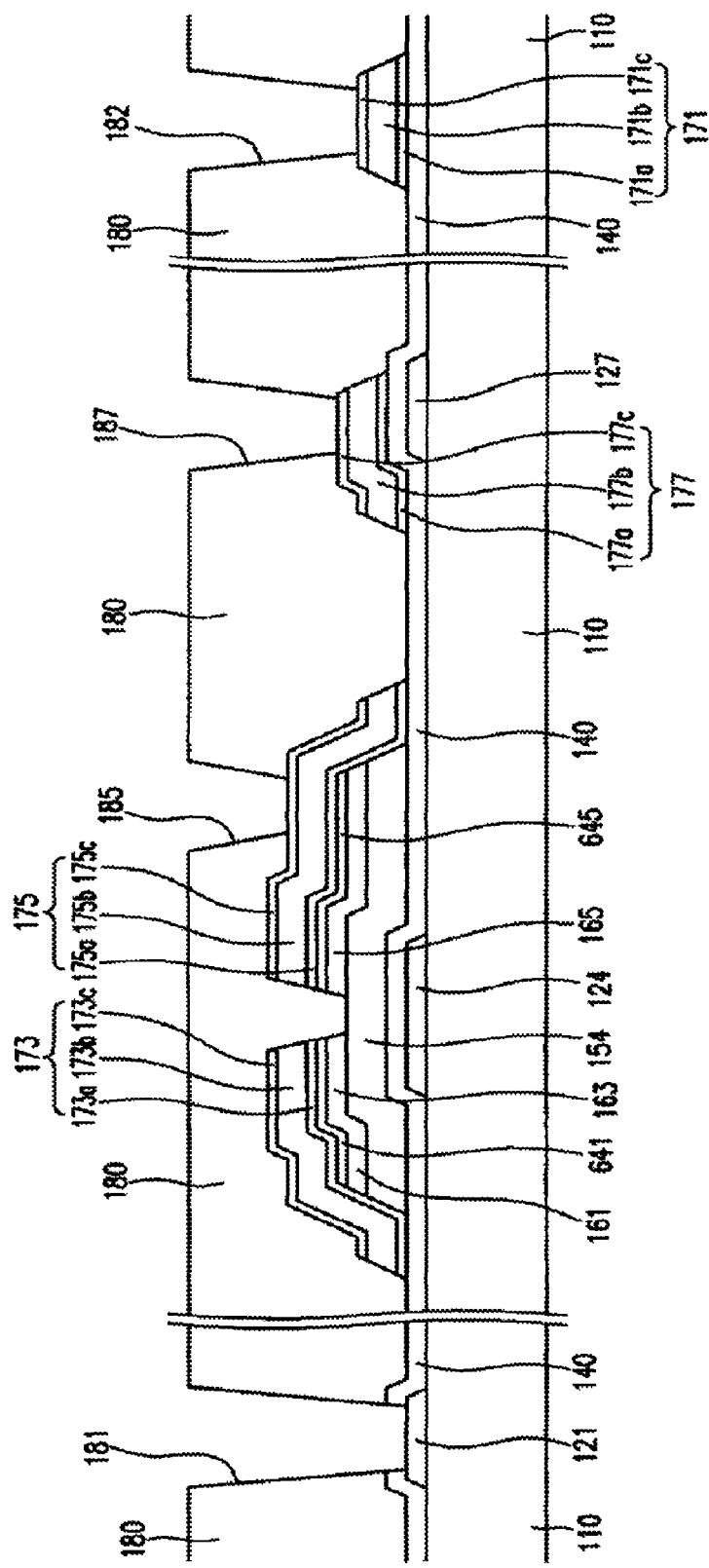
FIG. 6B is a sectional view of the TFT array panel shown in FIG. 6A taken along the line VIb-VIb' in the step following the step shown in FIG. 5B.

Referring to FIGS. 6A and 6B, a passivation layer 180 is deposited and dry etched along with the gate insulating layer 140 to form a plurality of contact holes 185, 187, and 182. The gate insulating layer 140 and the passivation layer 180 are preferably etched under an etch condition having substantially the same etch ratio for both the gate insulating layer 140 and the passivation layer 180.

When the passivation layer comprises a photosensitive material, the contact holes can be formed using photolithography.

Finally, as shown in FIGS. 1 and 2, a plurality of pixel electrodes 190 and a plurality of contact assistants 82 are formed by sputtering and photo-etching an IZO layer or an ITO layer.

Embodiment 2

The data lines and the semiconductors are formed by different photo etching processes using different photo masks in the first embodiment. However, the data lines and the semiconductors may be simultaneously formed by a photo etching process using the same photo mask to reduce production costs. Such an embodiment will be described in detail with reference to the drawings.

Figure 7:
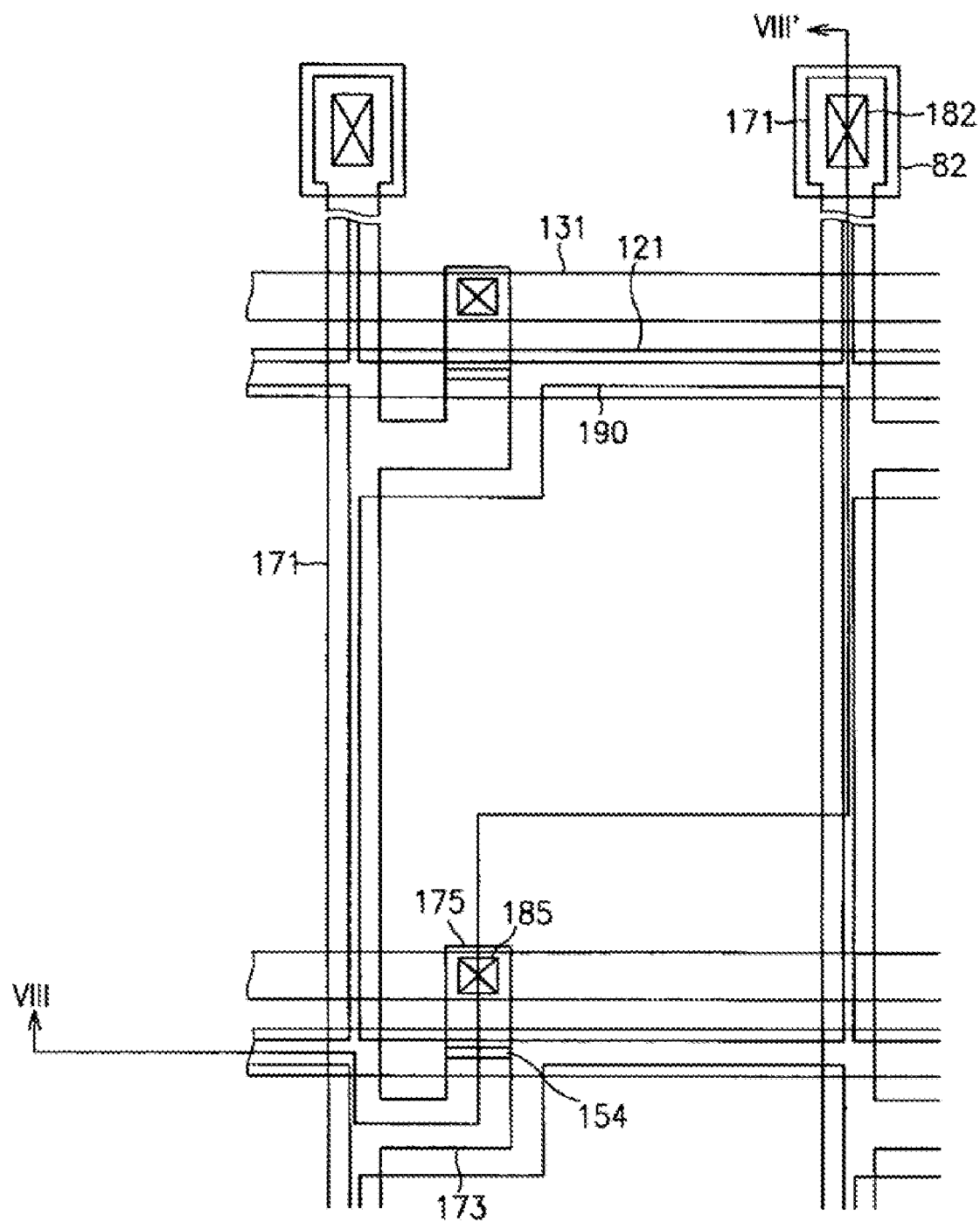
FIG. 7 is a layout view of a TFT array panel for an LCD according to another embodiment of the present invention.
Figure 8:
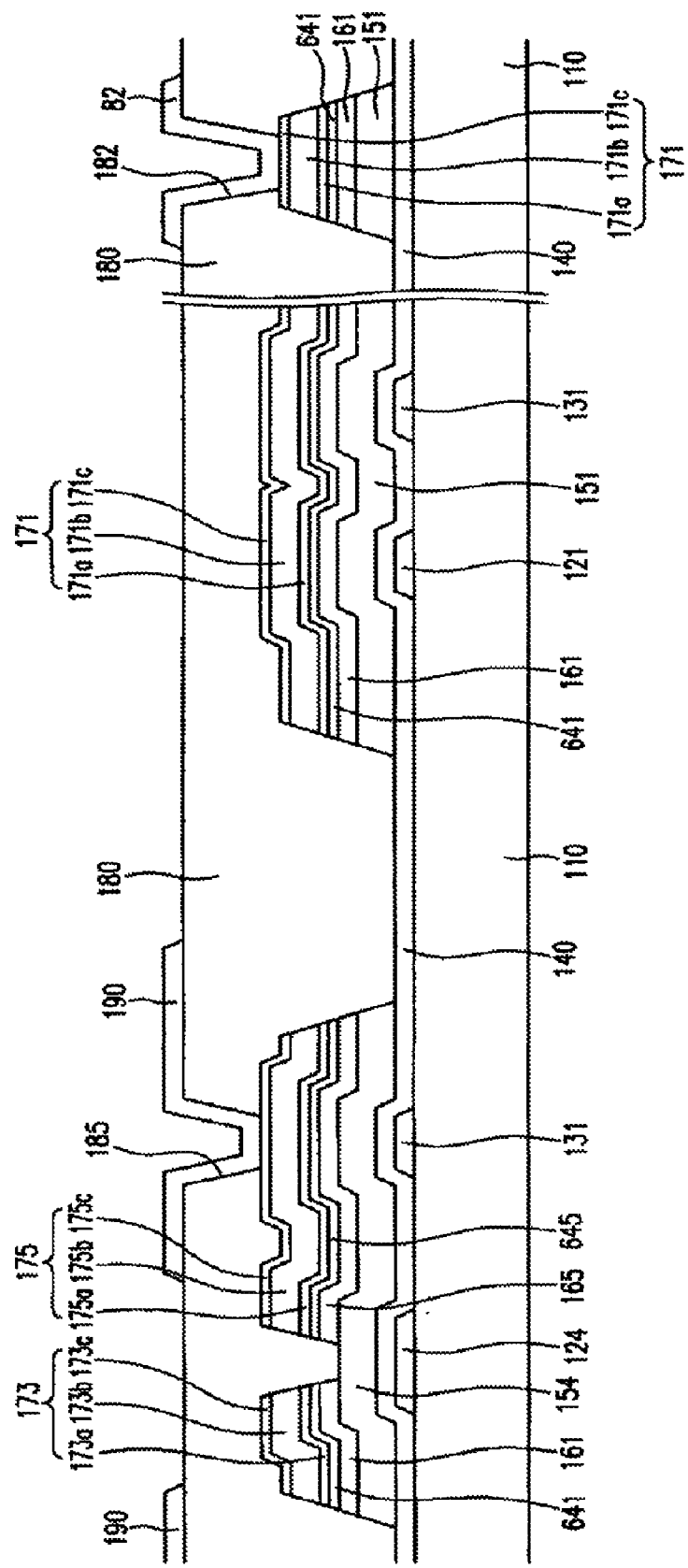
FIG. 8 is a sectional view of the TFT array panel shown in FIG. 7 taken along the line VIII-VIII'.

FIG. 7 is a layout view of a TFT array panel for an LCD according to another embodiment of the present invention. FIG. 8 is a sectional view of the TFT array panel shown in FIG. 7 taken along the line VIII-VIII'.

Referring to FIGS. 7 and 8, a layer structure of the present embodiment is very similar with that of the TFT array panel shown in FIGS. 1 and 2. That is, gate lines 121 having gate electrodes 124 are formed on an insulating substrate 110. A gate insulating layer 140, semiconductor stripes 151 having protrusions 154, and ohmic contacts 161 and 165 are sequentially formed on the gate lines 121. Diffusion barriers 641 and 645 are formed on the ohmic contacts 161 and 165.

A plurality of data lines 171 having source electrodes 173 and a plurality of drain electrodes 175 are formed on the diffusion barriers 641 and 645 and the gate insulating layer 140. A passivation layer 180 is formed on the data lines 171 and the source electrodes 173. The passivation layer 180 has a plurality of contact holes 182 and 185. A plurality of pixel electrodes 190 and a plurality of contact assistants 82 are formed on the passivation layer 180.

However, the TFT array panel according to the present embodiment includes a plurality of storage electrode lines 131 which are separated from the gate lines 121 and are overlapped by the drain electrode 175 to form storage capacitors. The storage electrode lines 131 replace the expansion 127 of the TFT array panel shown in FIGS. 1 and 2.

The storage capacitors are implemented by overlapping the storage lines 131 with the pixel electrodes 190. The storage electrode lines 131 are supplied with a predetermined voltage such as the common voltage. The storage electrode lines 131 may be omitted if the storage capacitance generated by the overlapping of the gate lines 121 and the pixel electrodes 190 is sufficient. The storage electrode lines 131 may be formed along a boundary of the pixels to enhance an aperture ratio.

The data lines 171 and the drain electrodes 173 have substantially the same planar pattern as the diffusion barriers 641 and 645 and the ohmic contacts 161 and 165. The semiconductor stripes 151 have substantially the same planar pattern as the ohmic contacts 161 and 165, except for the protrusions 154. The semiconductor stripes have exposed portions which are not covered by the source electrodes 173 and the drain electrodes 175 and are disposed therebetween.

Each data line 171 has an end portion exposed through the contact hole 182 for contact with an external driving circuit. The exposed end portion of the data line 171 is coupled with the contact assistant 82 through the contact hole 182. The gate lines 121 may have such end portions, when the gate lines 121 are coupled with external circuits.

A method of manufacturing the TFT array panel illustrated in FIGS. 7 and 8 will be now described in detail with reference to FIGS. 9A to 13 as well as FIGS. 7 and 8.

Figure 9A:
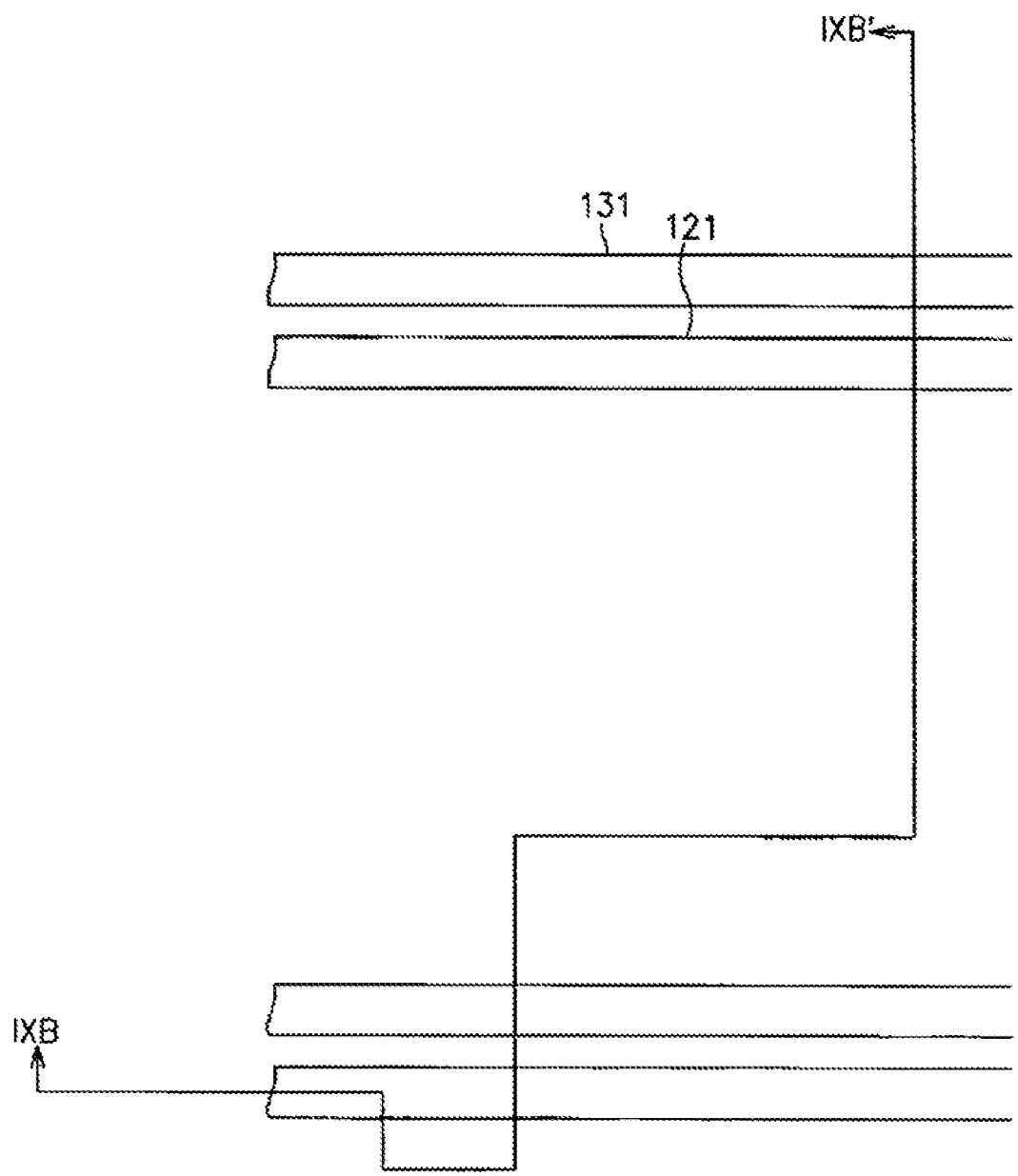
FIGS. 9A, 12A, and 13B are layout views of the TFT array panel shown in FIGS. 7 and 8 in intermediate steps of a manufacturing method according to an embodiment of the present invention.
Figure 10:
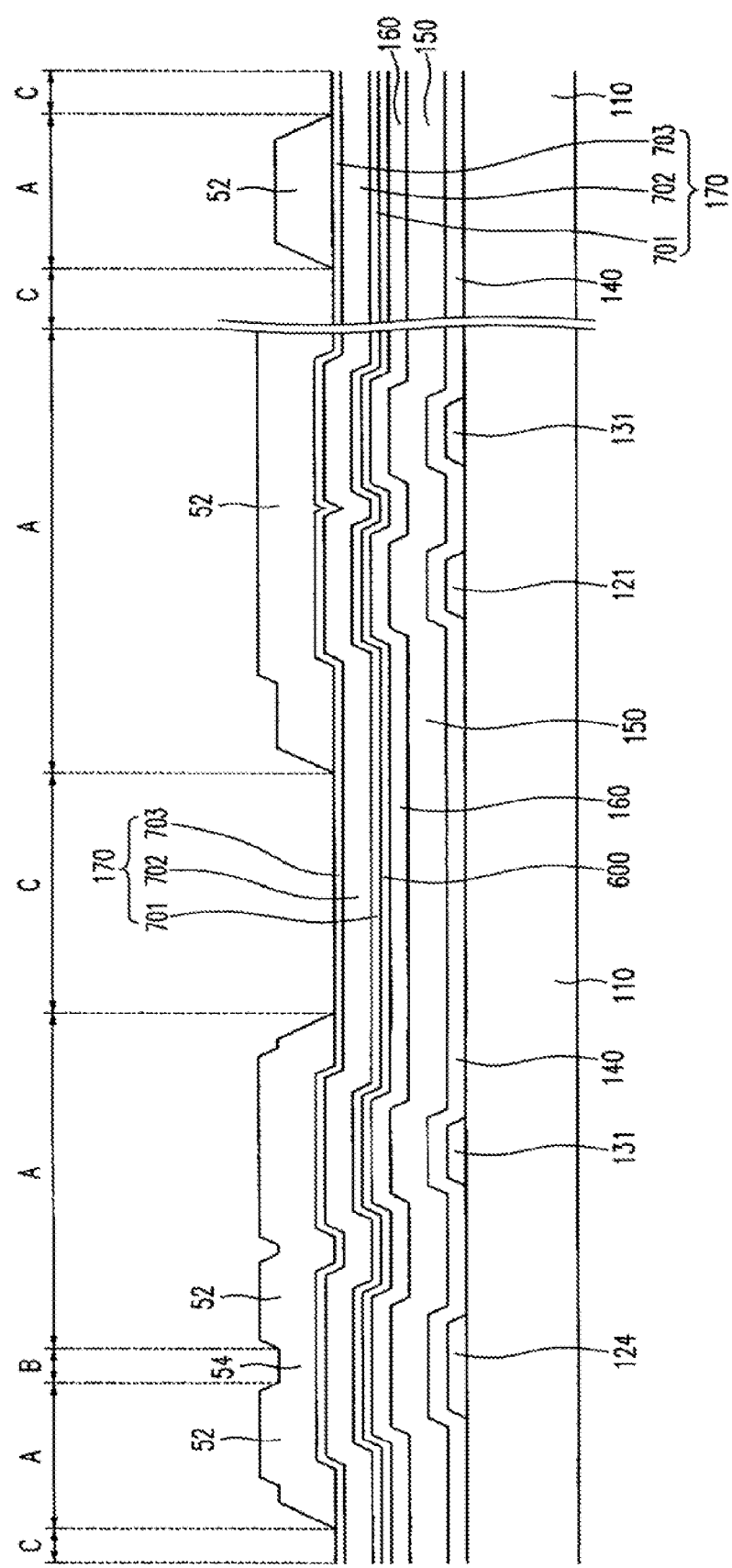
FIG. 10 is a sectional view of the TFT array panel in the step following the step shown in FIG. 9B.
Figure 11:
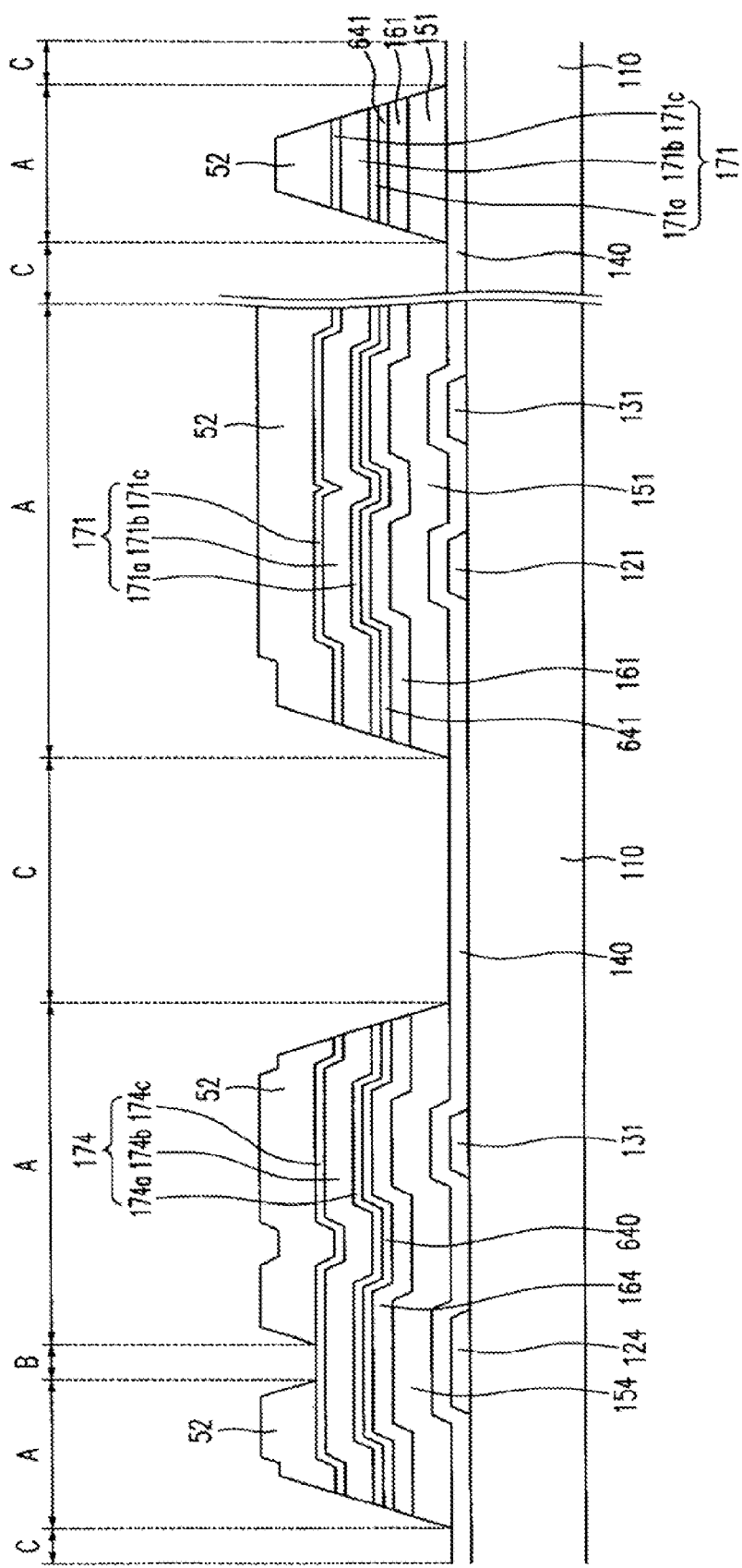
FIG. 11 is a sectional view of the TFT array panel in the step following the step shown in FIG. 10.
Figure 12A:
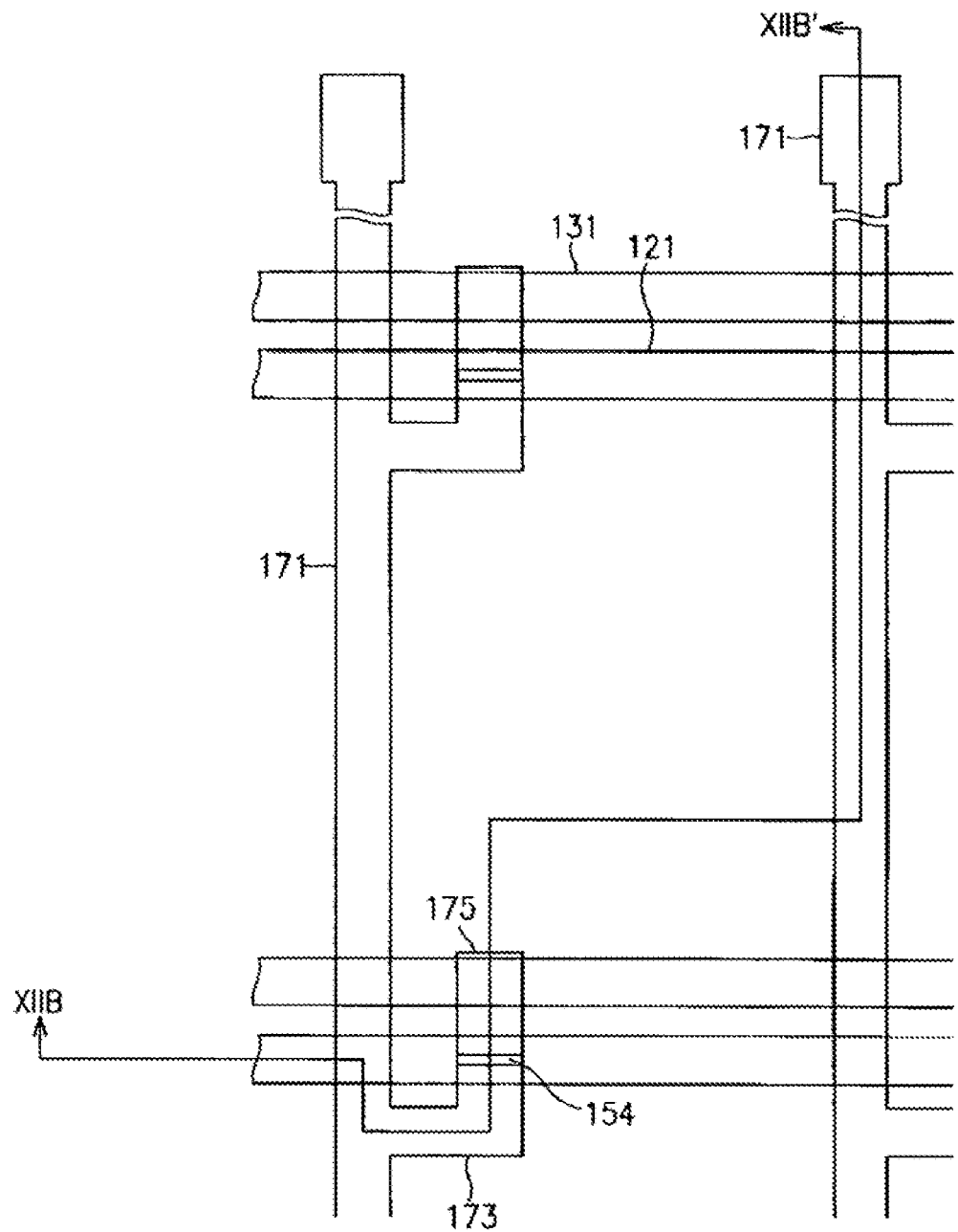
Figure 12B:
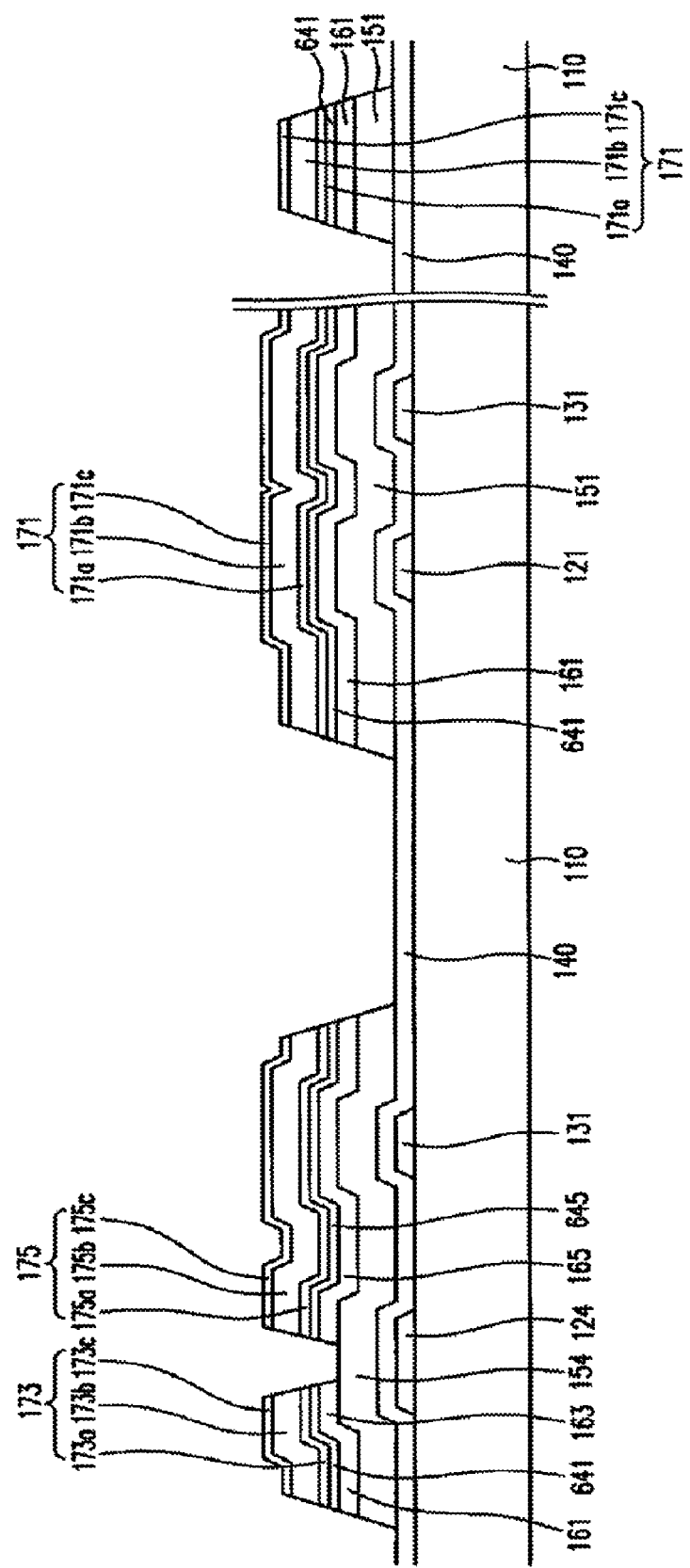
FIG. 12B is a sectional view of the TFT array panel shown in FIG. 12A taken along the line XIIB-XIIB'.
Figure 13A:
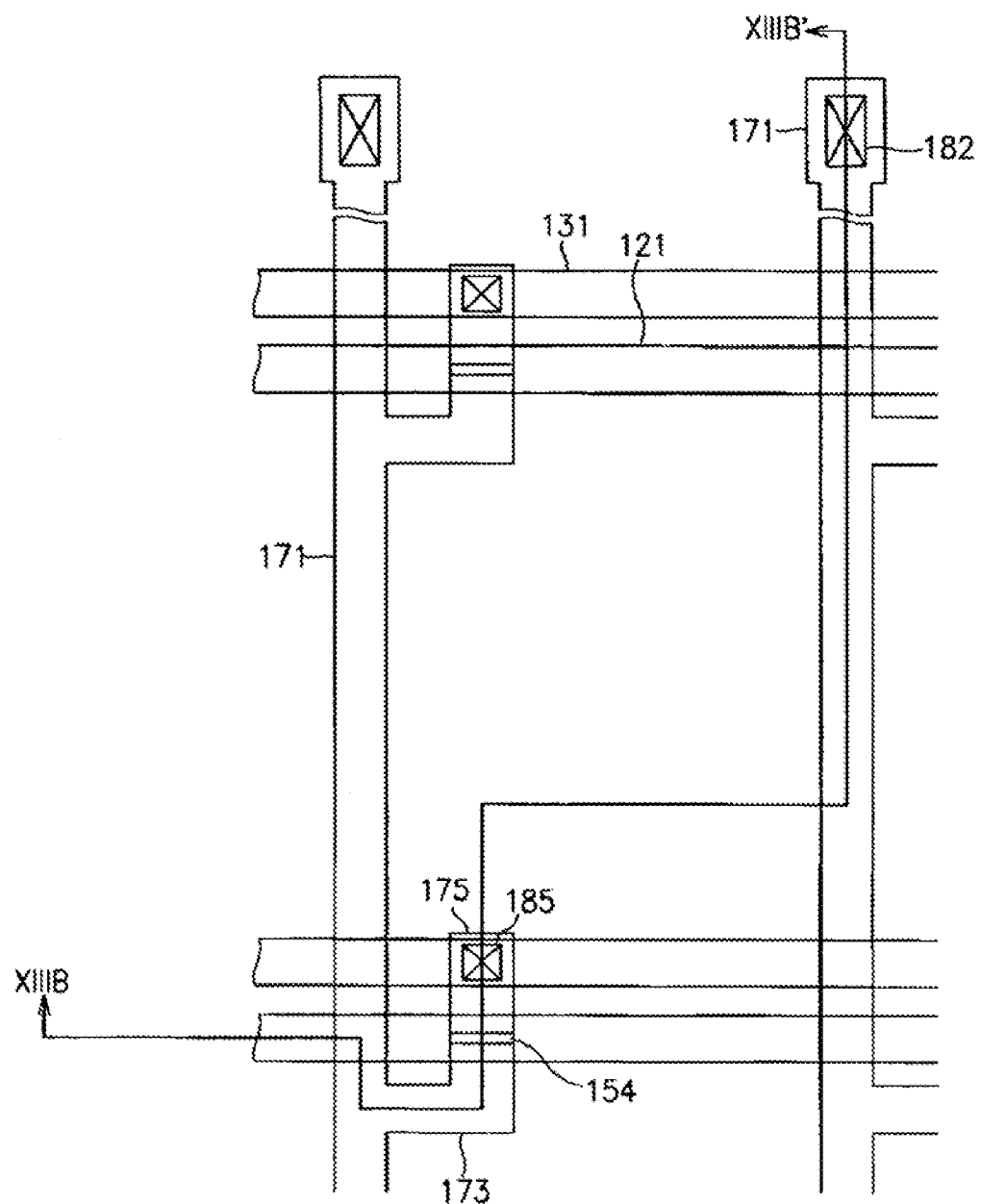
Figure 13B:
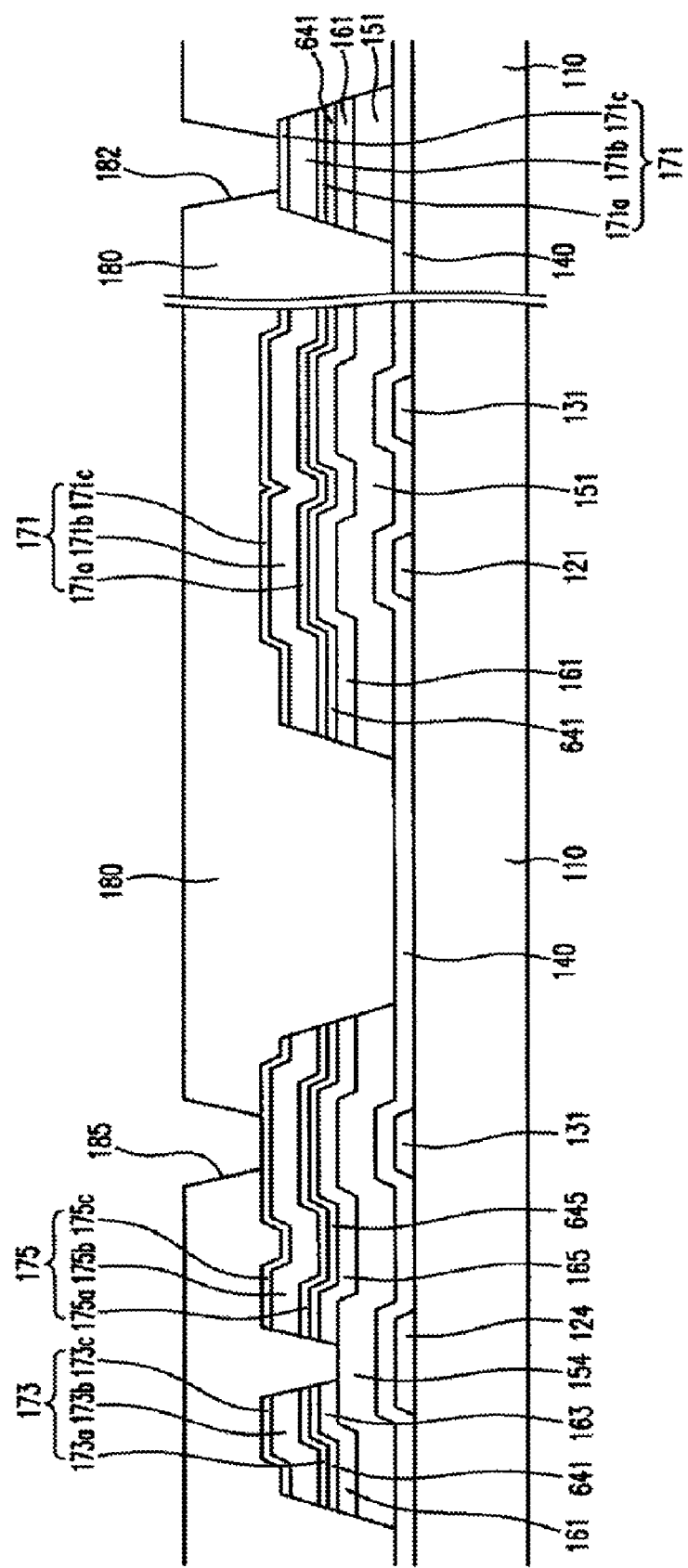

FIGS. 9A, 12A, and 13B are layout views of the TFT array panel shown in FIGS. 7 and 8 in intermediate steps of a manufacturing method according to an embodiment of the present invention. FIG. 9B is a sectional view of the TFT array panel shown in FIG. 9A taken along the line IXB-IXB'. FIG. 10 is a sectional view of the TFT array panel in the step following the step shown in FIG. 9B. FIG. 11 is a sectional view of the TFT array panel in the step following the step shown in FIG. 10. FIG. 12B is a sectional view of the TFT array panel shown in FIG. 12A taken along the line XIIB-XIIB'. FIG. 13B is a sectional view of the TFT array panel shown in FIG. 13A taken along the line XIIIB-XIIIB'.

At first, as shown in FIGS. 9A and 9B, a metal layer is formed on an insulating substrate 110 by a method such as sputtering, and is photo-etched to form gate lines 121 having gate electrodes 124.

A gate insulating layer 140 and first to third a-Si layers 150, 160, and 600 are sequentially deposited on the gate lines 121. The first a-Si layer 150 comprises intrinsic amorphous silicon. The second a-Si layer 160 comprises extrinsic amorphous silicon. The third a-Si layer 600 comprises extrinsic amorphous silicon containing nitrogen.

The gate insulating layer 140 preferably comprises silicon nitride with a thickness of about 2,000 Å to about 5,000 Å.

The first to third a-Si layers 150, 160, and 600 may be deposited in a chamber by an in-situ method. After forming the first a-Si layer 150, the second a-Si layer 160 is formed by deposition while adding n-type impurities. Then, the third a-Si layer 600 is formed by deposition while adding n-type impurities and one or both of $NH_3$ and $N_2$ gas.

A data conductor layer 170 is deposited on the third a-Si layer 600 by a method such as sputtering. The data conductor layer 170 preferably has triple metal layers including a first layer 701 comprising a Mo-containing metal, a second layer 702 comprising an Al-containing metal, and a third layer 703 comprising a Mo-containing metal.

A photoresist film is coated on the third layer 703. The photoresist film is exposed to light through an exposure mask (not shown), and is developed such that the developed photoresist has a position-dependent thickness as shown in FIG. 10. The developed photoresist includes a plurality of first to third portions. The first portions 54 are located on channel areas B and the second portions 52 are located on the data line areas A. No reference numeral is assigned to the third portions located on the remaining areas C since they have substantially zero thickness. Here, the thickness ratio of the first portions 54 to the second portions 52 is adjusted depending upon the process conditions in the subsequent process steps. It is preferable that the thickness of the first portions 54 is equal to or less than half of the thickness of the second portions 52.

The position-dependent thickness of the photoresist is obtained by several techniques, for example, by providing translucent areas on the exposure mask as well as transparent areas and light blocking opaque areas. The translucent areas may have a slit pattern, a lattice pattern, or be a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern comprising a reflowable material is formed by using a normal exposure mask with only transparent areas and opaque areas, it is subjected to a reflow process to flow onto areas without the photoresist, thereby forming thin portions.

Next, the photoresist film 52 and 54 and the underlying layers are etched such that the data lines 171, drain electrodes 175, and the underlying layers are left on the data areas A, only the intrinsic semiconductor layer is left on the channel areas B, and the gate insulating layer 140 is exposed on the remaining areas C.

A method to form such a structure will now be described.

Referring to FIG. 11, the exposed portions of the first to third layers 170a, 170b, and 170c on the other areas C are removed to expose the underlying portions of the third a-Si layer 600.

Next, referring to FIG. 11, the exposed portions of the third a-Si layer 600 and the underlying portions of the extrinsic semiconductor layer 160 and the intrinsic semiconductor layer 150 on the areas C as well as the photoresist pattern 54 and 52 are removed by dry etching to expose source/drain (S/D) metals 174 of the areas B.

The photoresist pattern 54 of the channel areas B may be simultaneously removed by etching to remove the third to first a-Si layers 640, 160, and 150 or by separately etching each of the third to first a-Si layers 640, 160, and 150. Residual photoresist of the photoresist pattern 54 in the channel area B is removed by ashing. In this step, the semiconductor stripes 151 are completely formed.

Data conductor layer 170 may be etched by dry etching. Data conductor layer 170 may be sequentially etched along with the third to first a-Si layers 600, 160, and 150 to simplify the manufacturing process. In this case, the four layers 170, 600, 160, and 150 may be sequentially etched in a dry etching chamber, which may be referred to as an "in-situ" method.

Next, as shown in FIGS. 12A and 12B, portions of the S/D metals 174 and the underlying portions of the extrinsic semiconductor layer 164 on the channel areas B are removed by etching. At this time, the exposed portions of the semiconductor 154 may be etched to have a reduced thickness and the second portion 52 of the photoresist pattern may also be partially removed.

Accordingly, the source electrodes 173 and the drain electrodes 175 are separated from each other, and, simultaneously, the data lines and the diffusion barriers 641 and 645 and the ohmic contacts 163 and 165 thereunder are completed.

Finally, the residual second portions 52 of the photoresist pattern left on the data areas A are removed.

Thereafter, as shown in FIGS. 13A and 13B, a passivation layer 180 is formed to cover the data lines 171, the drain electrodes 175, and the exposed portions of the semiconductor stripes 151, which are not covered with the data lines 171 and the drain electrodes 175. The passivation layer 180 preferably comprises a photosensitive organic material having a good flatness characteristic, a dielectric insulating material having a low dielectric constant of under 4.0 such as a-Si:C:O and a-Si:O:F formed by plasma enhanced chemical vapor deposition (PECVD), or an inorganic material such as silicon nitride and silicon oxide.

Next, the passivation layer 180 is photo-etched to form a plurality of contact holes 185 and 182. When the passivation layer 180 comprises a photosensitive material, the contact holes 185 and 182 may be formed using photolithography.

Finally, as shown in FIGS. 7 and 8, a plurality of pixel electrodes 190 and a plurality of contact assistants 82 are formed by sputtering and photo-etching an IZO layer or an ITO layer. The pixel electrodes 190 and the contact assistants 82 are respectively connected to the drain electrodes 175 and an end of the data lines 171 through the contact holes 185 and 182.

Embodiment 3

The present embodiment illustrates a thin film transistor array panel having color filters.

Figure 14:
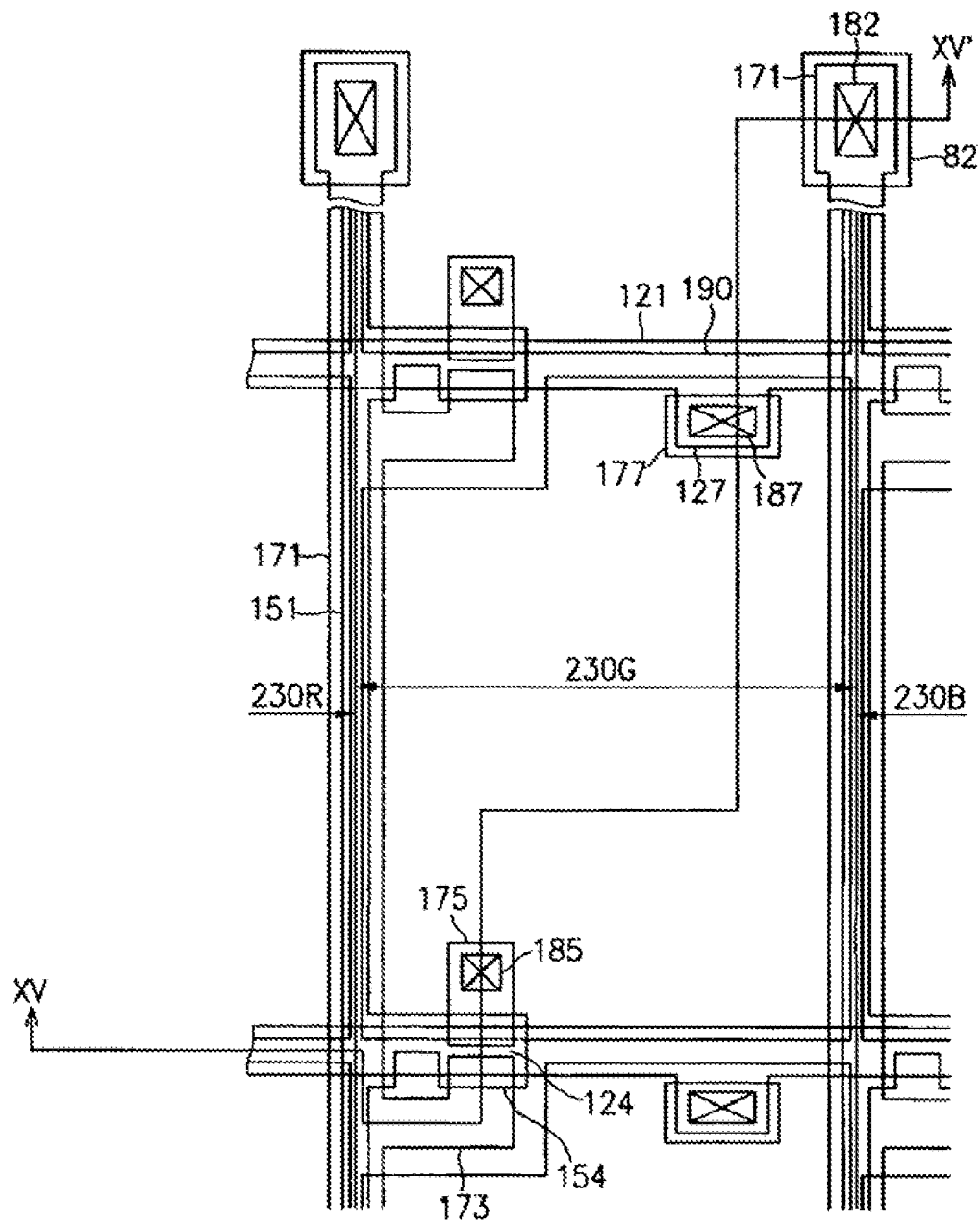
FIG. 14 is a layout view of a TFT array panel for an LCD according to another embodiment of the present invention.
Figure 15:
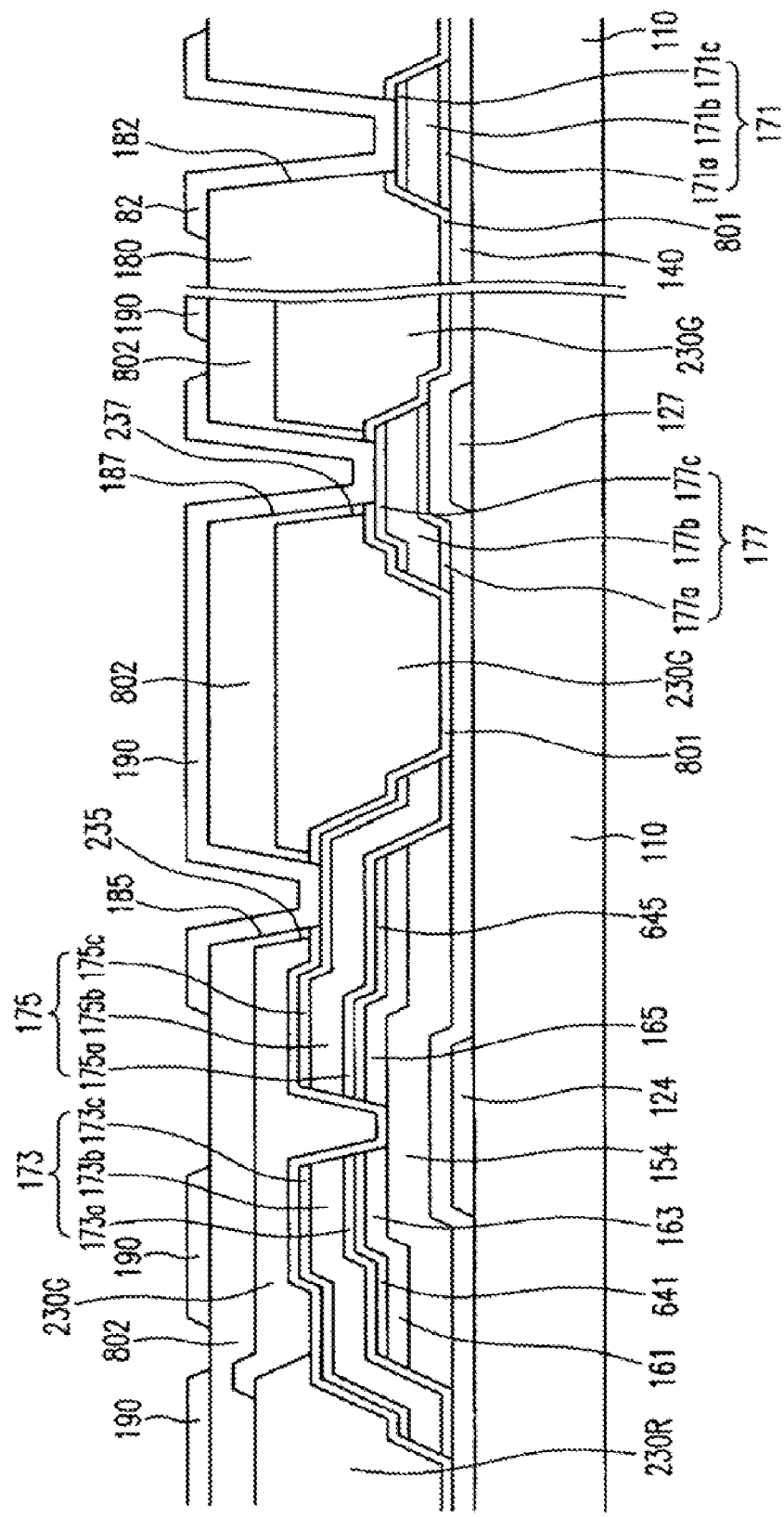
FIG. 15 is a sectional view of the TFT array panel shown in FIG. 14 taken along the line XV-XV'-XV''.

FIG. 14 is a layout view of a TFT array panel for an LCD according to another embodiment of the present invention. FIG. 15 is a sectional view of the TFT array panel shown in FIG. 14 taken along the line XV-XV'.

A plurality of gate lines 121 for transmitting gate signals are formed on an insulating substrate 110. The gate lines 121 are primarily formed in the horizontal direction and partial portions thereof form a plurality of gate electrodes 124. Also, different partial portions of the gate lines 121 which extend in the lower direction form a plurality of expansions 127.

A gate insulating layer 140 preferably comprising silicon nitride (SiNx) is formed on the gate lines 121.

A plurality of semiconductor stripes 151 preferably comprising hydrogenated amorphous silicon (abbreviated to "a-Si") is formed on the gate insulating layer 140. Each semiconductor stripe 151 extends substantially in the longitudinal direction and is curved periodically. Each semiconductor stripe 151 has a plurality of projections 154 branching out toward the gate electrodes 124. The width of each semiconductor stripe 151 widens near the gate lines 121 such that the semiconductor stripe 151 covers large areas of the gate lines 121.

A plurality of ohmic contact stripes and islands 161 and 165 preferably comprising silicide or n+ hydrogenated a-Si heavily doped with an n-type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

A plurality of diffusion barrier stripes 641 and islands 645 are formed on the ohmic contact stripes 161 and islands 165. The diffusion barrier stripes 641 and islands 645 preferably comprise silicide or n+ hydrogenated a-Si heavily doped with an n-type impurity and include nitrogen ($N_2$). Accordingly, the diffusion barrier stripes 641 and islands 645 comprise the same material as the ohmic contact stripes 161 and islands 165 with the addition of N. The diffusion barrier stripes 641 and islands 645 have the same planar pattern as the ohmic contact stripes 161 and islands 165.

A plurality of data lines 171, a plurality of drain electrodes 175, and a plurality of storage capacitor conductors 177 are formed on the diffusion barrier 641 and 645 and the gate insulating layer 140.

The data lines 171 for transmitting data voltages extend substantially in the longitudinal direction and intersect the gate lines 121 to define pixel areas arranged in a matrix. A plurality of branches of each data line 171, which project toward the drain electrodes 175, form a plurality of source electrodes 173. Each pair of the source electrodes 173 and the drain electrodes 175 is separated from each other and opposite each other with respect to a gate electrode 124.

A gate electrode 124, a source electrode 173, and a drain electrode 175 along with a projection 154 of a semiconductor stripe 151 forms a TFT having a channel formed in the projection 154 disposed between the source electrode 173 and the drain electrode 175. The storage capacitor conductor 177 overlaps the expansion 127 of the gate line 121.

The data line 171, the drain electrode 175, and the storage capacitor conductor 177 comprise first layers 171a, 175a, and 177a, second layers 171b, 175b, and 177b, and third layers 171c, 175c, and 177c, respectively. The first layers 171a, 175a, and 177a and the third layers 171c, 175c, and 177c are respectively disposed at lower and upper sides of the second layers 171b, 175b, and 177b. The second layers 171b, 175b, and 177b preferably comprise an Al-containing metal such as Al, which has low resistivity, to reduce signal delay and voltage drop. The first layers 171a, 175a, and 177a preferably comprise a metal for preventing diffusion of Al such as Ti, Ta, Cr, Mo, and their alloys. The third layers 171c, 175c, and 177c preferably comprise a metal having good physical, chemical, and electrical contact characteristics with IZO or ITO such as Ti, Ta, Cr, Mo, and their alloys.

In the present embodiment, the first and third layers 171a, 171c, 175a, 175c, 177a, and 177c comprise Mo, and the second layer 171b, 175b, and 177b comprises Al.

The diffusion barrier stripes 641 and islands 645 and the ohmic contacts 161 and 165 are interposed between the semiconductor stripes 151 and the data lines 171 and between the drain electrodes 175 and the projections 154 of the semiconductor stripe 151. The diffusion barrier stripes 641 and islands 645 prevent metal particles of the data lines 171 and the drain electrodes 175 from diffusing into the semiconductor stripes 151. The diffusion barrier stripes 641 and islands 645 reduce contact resistance between the semiconductor stripes 151 and the data lines 171 and between the drain electrodes 175 and the projections 154 of the semiconductor stripe 151 along with the ohmic contacts 161 and 165. Here, nitrogen in the diffusion barrier stripes 641 and islands 645 serves as an n-type impurity.

It is a distinguishing feature of the present embodiment that color filters 230R, 230G, and 230B are formed on the data line 171, the drain electrode 175, and the storage capacitor conductor 177. The color filters 230R, 230G, and 230B are formed along pixel columns which are partitioned by data lines 171. The red, green, and blue color filters 230R, 230G, and 230B are shown in turn.

The color filters 230R, 230G, and 230B are not formed on the end portions of the gate lines 121 and the data lines 171, which are coupled to external circuits. Two adjacent color filters 230R, 230G, and 230B overlap each other on the data lines 171. Accordingly, light leakage that may arise around a pixel area is prevented by the overlapping color filters 230R, 230G, and 230B. All of red, green, and blue color filters 230R, 230G, and 230B may be disposed on the data line 171 to overlap each other.

A first interlayer insulating layer 801 is formed under the color filters 230R, 230G, and 230B to prevent pigments of the color filters 230R, 230G, and 230B from permeating into the semiconductor protrusion 154. A second interlayer insulating layer 802 is formed on the color filters 230R, 230G, and 230B to prevent pigments of the color filters 230R, 230G, and 230B from permeating into a liquid crystal layer (not illustrated).

The interlayer insulating layers 801 and 802 may comprise an insulating material with a low dielectric constant such as a-Si:C:O and a-Si:O:F or $SiN_x$.

As described above, when the color filters 230R, 230G, and 230B are formed on the thin film transistor array panel and overlap each other on the data line 171, the opposite panel may have only a common electrode. Accordingly, assembly of the TFT panel and opposite panel is relatively easy and the aperture ratio increases.

In the second interlayer insulating layer 802, a plurality of contact holes 185, 187, and 182 are formed to expose the drain electrode 175, the storage capacitor conductor 177, and end portion of the data line 171, respectively.

A plurality of pixel electrodes 190 and a plurality of contact assistants 82 comprising IZO or ITO are formed on the passivation layer 180 and the second interlayer insulating layer 802.

Since the pixel electrode 190 is physically and electrically connected with the drain electrode 175 and the storage capacitor conductor 177 through the contact holes 185 and 187, respectively, the pixel electrode 190 receives the data voltage from the drain electrodes 175 and transmits it to the storage capacitor conductor 177.

The pixel electrode 190 to which the data voltage is applied generates an electric field with a common electrode (not illustrated) of the opposite panel (not illustrated) to which common voltage is applied, so that the liquid crystal molecules in the liquid crystal layer are rearranged.

The contact assistant 82 supplements adhesion between the end portion of the data line 171 and external devices such as the driving integrated circuit, and protects the end portion of the data line 171. Applying the contact assistant 82 is optional.

A method of manufacturing a TFT array panel will be now described in detail with reference to FIGS. 16A to 17B as well as FIGS. 14 and 15.

Figure 16A:
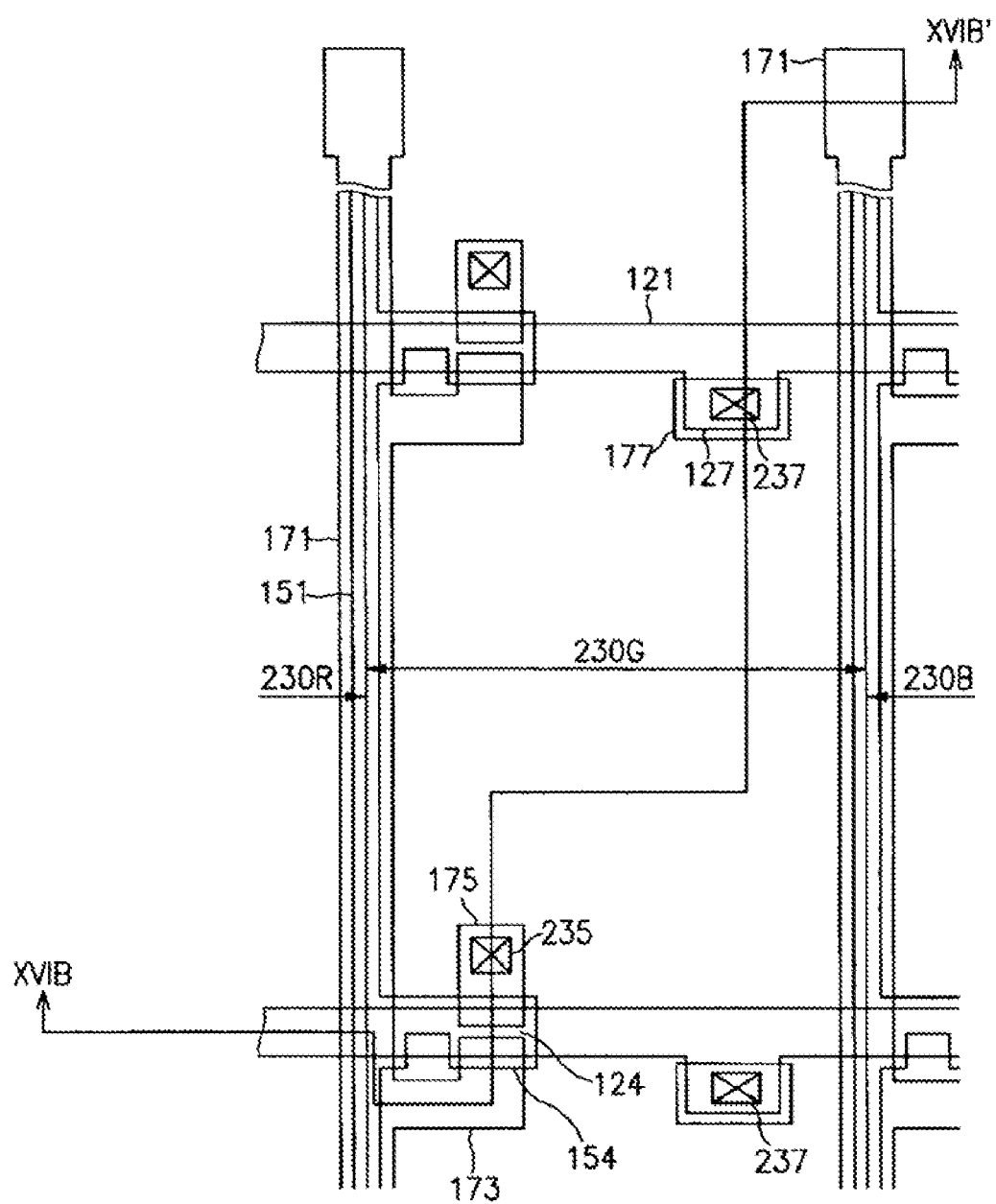
FIGS. 16A and 17A are layout views of the TFT array panel in intermediate steps of a manufacturing method according to an embodiment of the present invention.
Figure 17A:
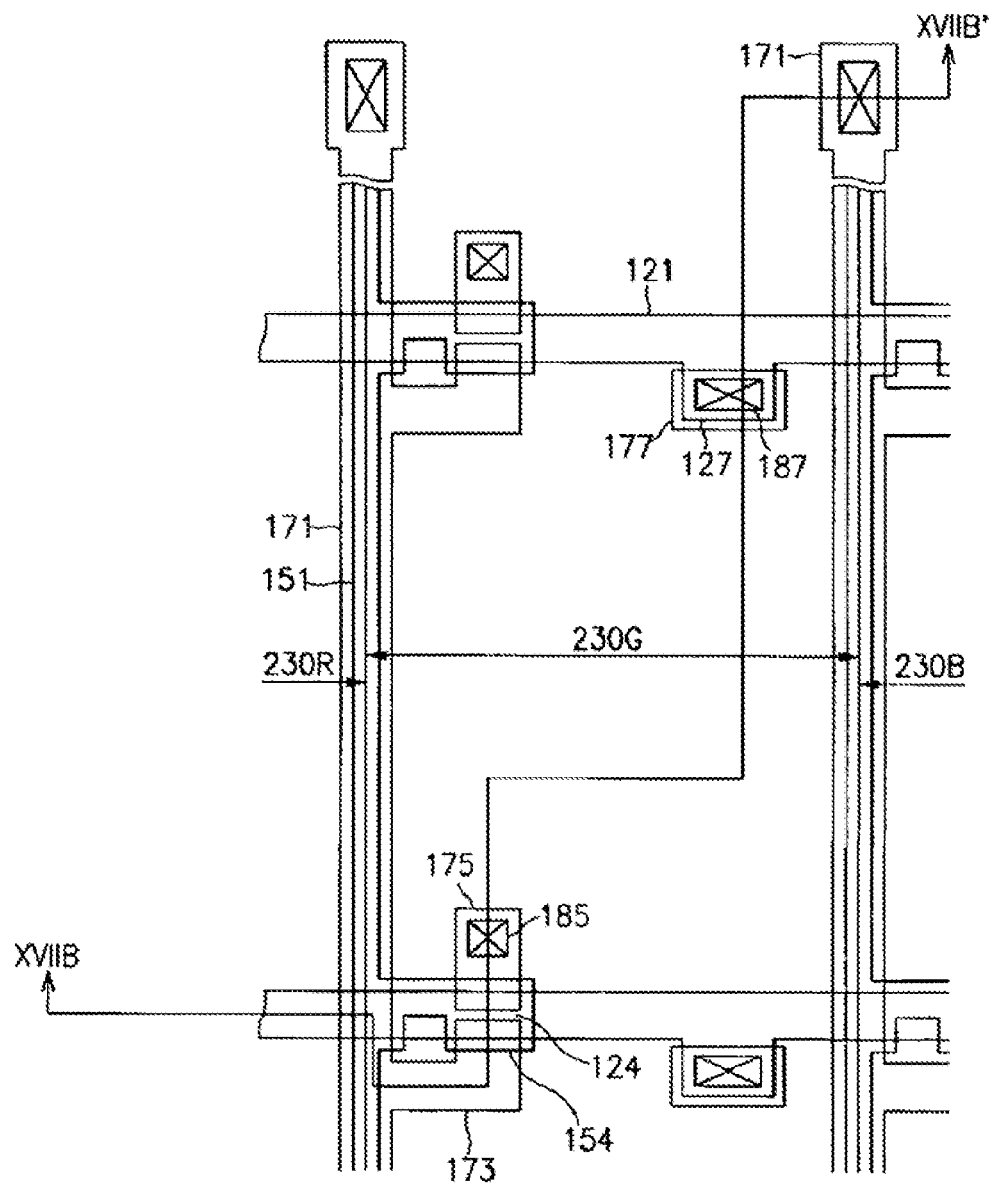
Figure 17B:
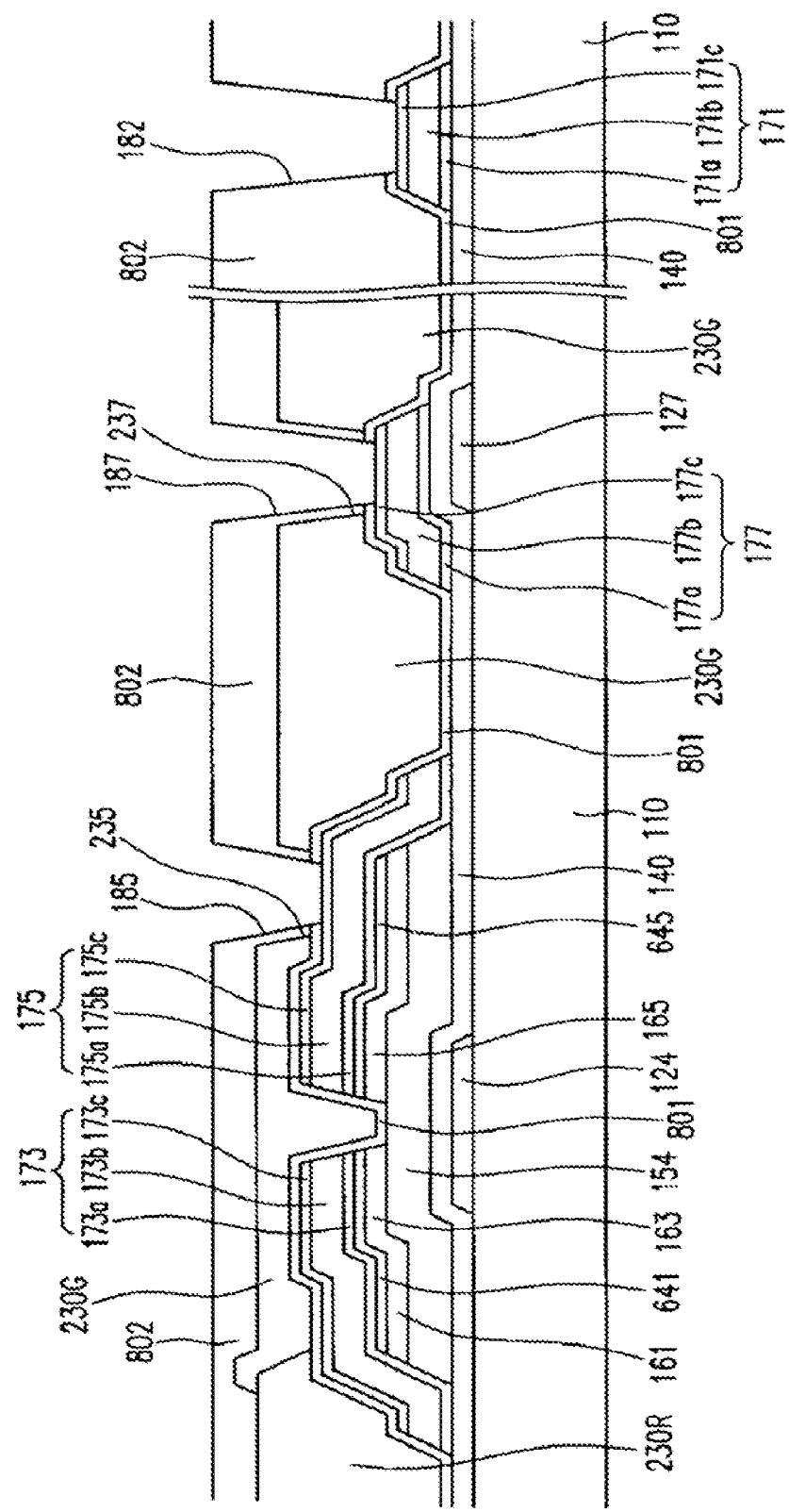
FIG. 17B is a sectional view of the TFT array panel shown in FIG. 17A taken along the line XVIb-XVII'-XVII''.

FIGS. 16A and 17A are layout views of the TFT array panel in intermediate steps of a manufacturing method according to an embodiment of the present invention. FIG. 16B is a sectional view of the TFT array panel shown in FIG. 16A taken along the line XVIB-XVIB'. FIG. 17B is a sectional view of the TFT array panel shown in FIG. 17A taken along the line XVIIB-XVIIB'.

Referring to FIGS. 16A and 16B, a plurality of gate electrodes 124, a gate insulating layer 140, a plurality of semiconductor stripes 151, a plurality of ohmic contact assistants 161 and 165, a plurality of diffusion barriers 641 and 645, and a plurality of data lines 171 and drain electrodes 175 are sequentially formed on the gate lines 121.

Next, organic photo-resist materials respectively containing pigments of red, green, and blue are coated and are patterned by a photo process to form a plurality of color filters 230R, 230G, and 230B in sequence. Here, a first interlayer insulating layer 801 comprising an inorganic insulating material such as $SiN_x$ or $SiO_2$ is formed on the data lines 171 and drain electrodes 175 before forming the color filters 230R, 230G, and 230B. The first interlayer insulating layer 801 prevents pigments of the color filters 230R, 230G, and 230B from permeating into the semiconductor protrusion 154. At this time, openings 235 and 237 exposing the drain electrode 175 and the storage capacitor conductor 177 are simultaneously formed.

Referring to FIGS. 17A and 17B, a second interlayer insulating layer 802 is formed by the coating of an organic insulating film having a low dielectric constant and a good flatness characteristic or by the PECVD of a low dielectric insulating material such as a-Si:C:O and a-Si:O:F having a dielectric constant lower than about 4.0.

Thereafter, the first and second interlayer insulating layers 801 and 802 are photo-etched to form a plurality of contact holes 182, 185, and 187. Here, the contact holes 185 and 187 exposing the drain electrodes 175 and the storage capacitor conductor 177 are formed in the openings 235 and 237 of the color filters 230R, 230G, and 230B Finally, as shown in FIGS. 14 and 15, a plurality of pixel electrodes 190 and a plurality of contact assistants 82 are formed by sputtering and photo-etching an IZO layer or an ITO layer. The pixel electrodes 190 are connected to the drain electrodes 175 and the storage capacitor conductor 177 through the contact holes 185 and 187.

Embodiment 4

An LCD according to the present embodiment has domain partitioning members which partition a pixel into a plurality of domains where liquid crystal molecules are aligned in predetermined directions.

Figure 18:
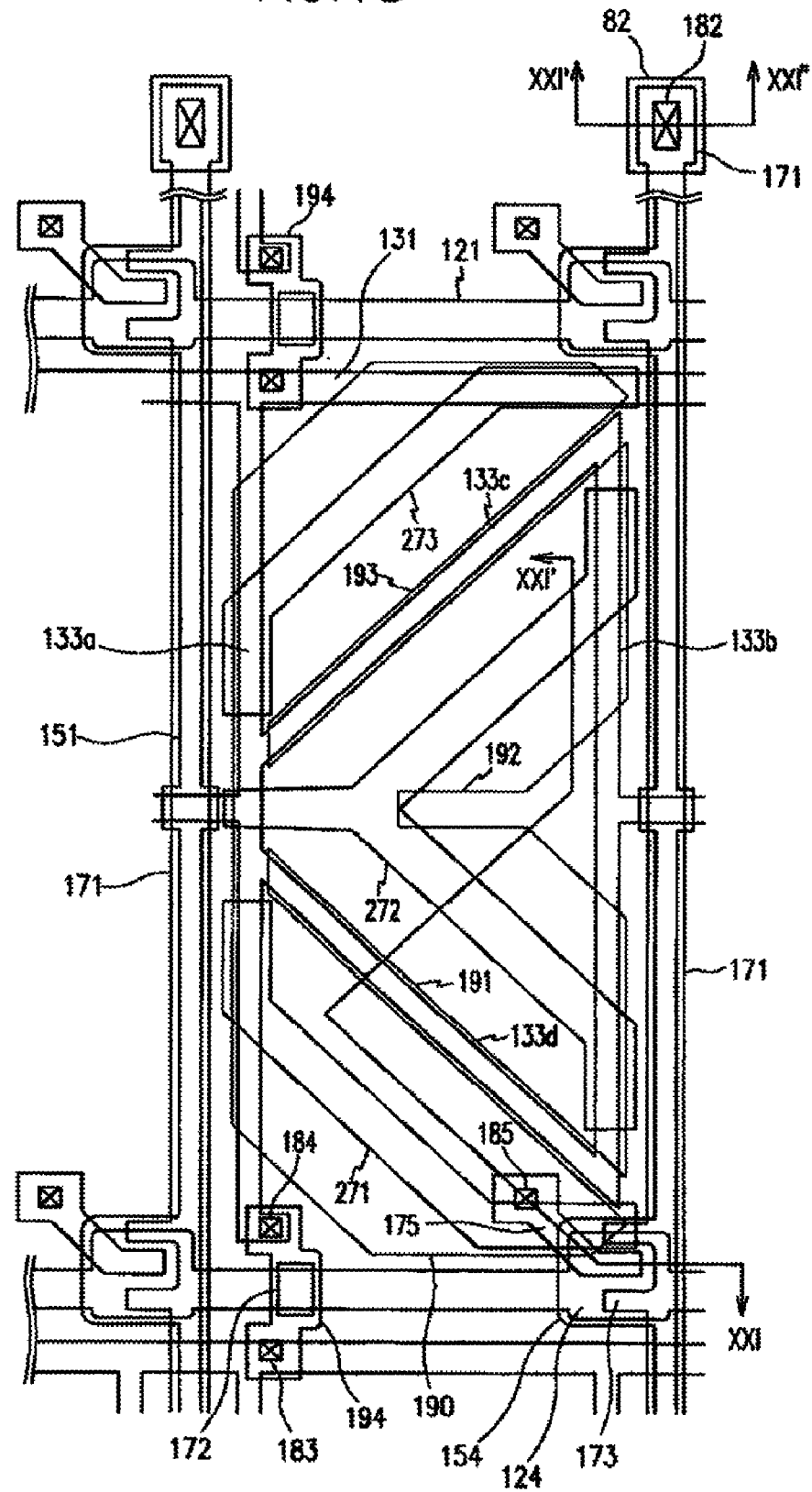
FIG. 18 is a layout view of an LCD according to another embodiment of the present invention.
Figure 19:
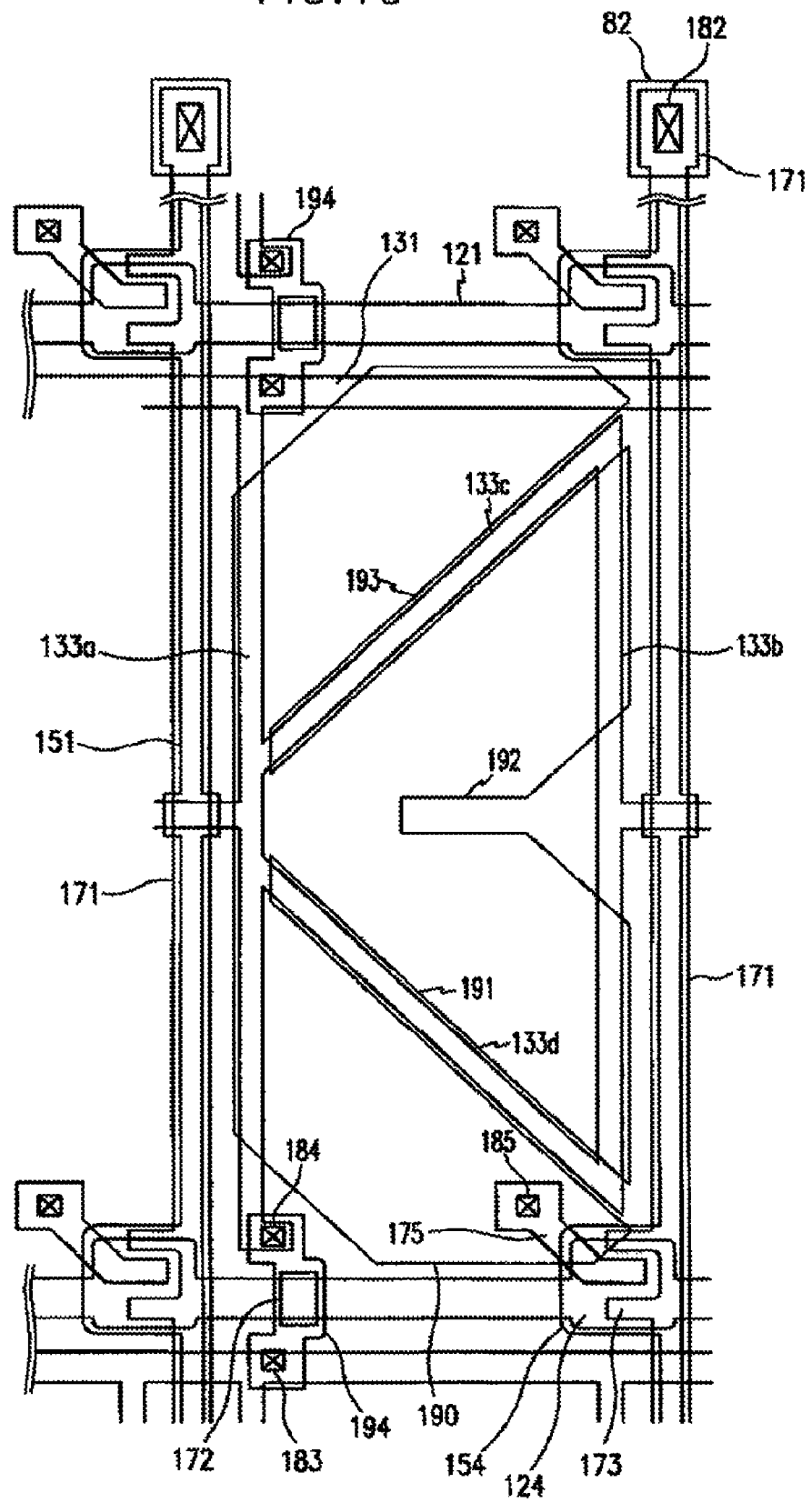
FIG. 19 is a layout view of a TFT array panel of the LCD shown in FIG. 18.
Figure 20:
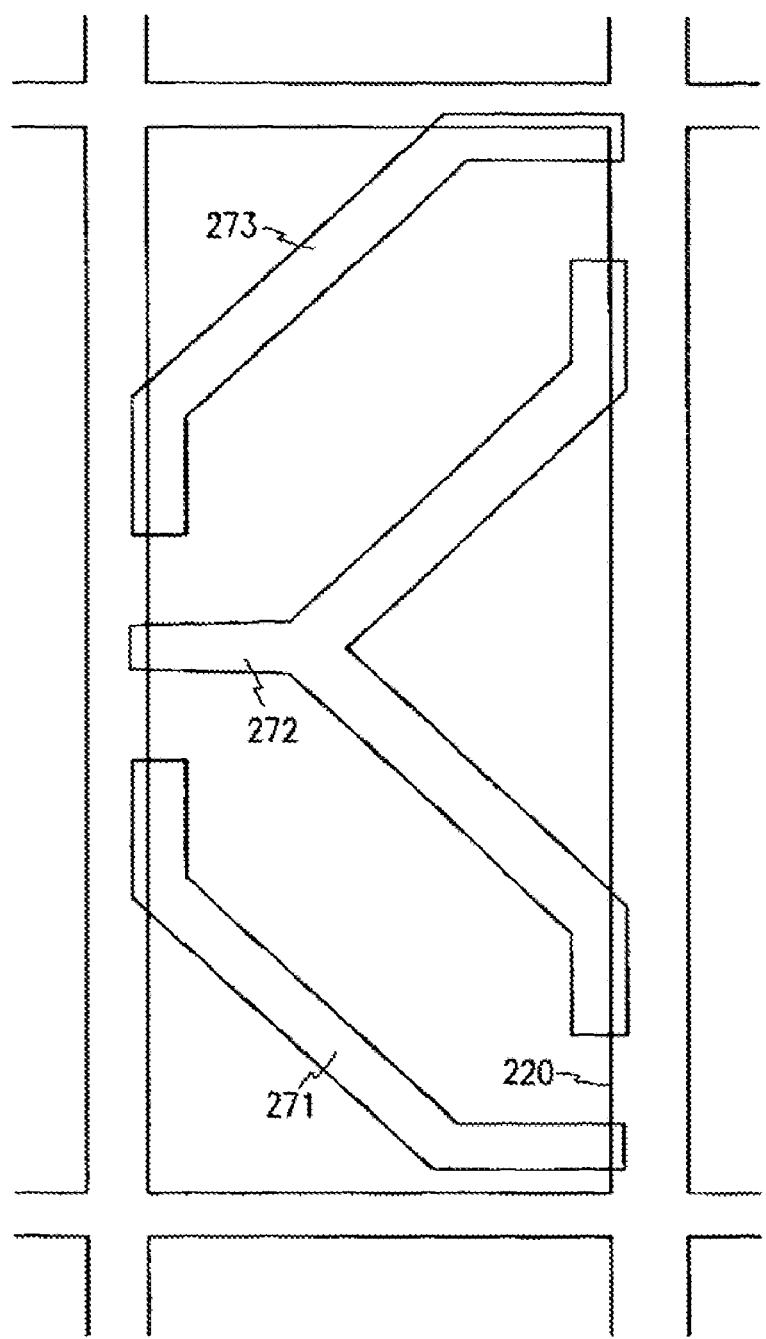
FIG. 20 is a layout view of an opposite panel of the LCD shown in FIG. 18.
Figure 21:
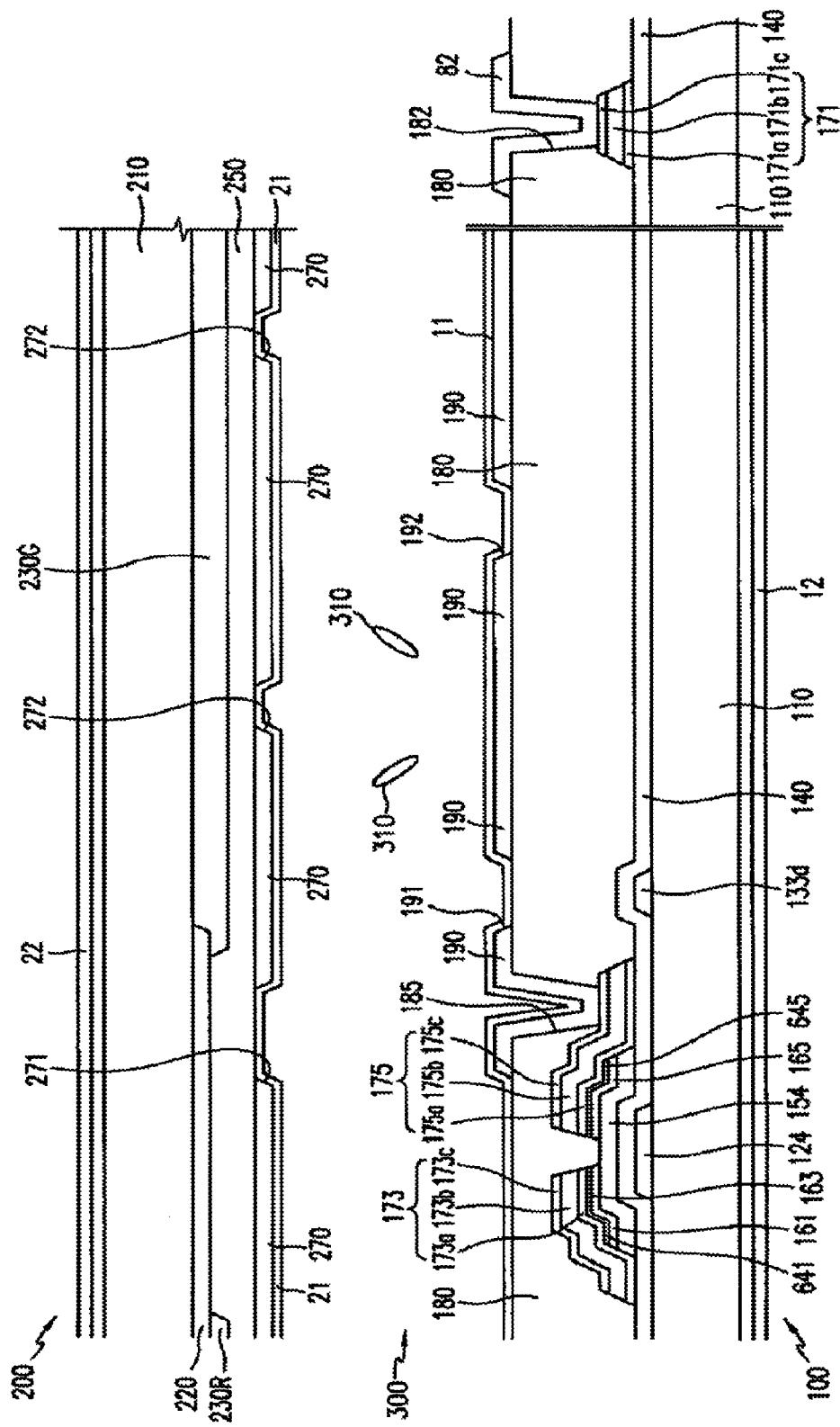
FIG. 21 is a sectional view of the LCD shown in FIG. 18 taken along the line XXI-XXI'-XXI''.

FIG. 18 is a layout view of an LCD according to another embodiment of the present invention. FIG. 19 is a layout view of a TFT array panel of the LCD shown in FIG. 18. FIG. 20 is a layout view of an opposing common electrode panel of the LCD shown in FIG. 18. FIG. 21 is a sectional view of the LCD shown in FIG. 18 taken along the line XXI-XXI'-XXI".

An LCD according to this embodiment includes a TFT array panel 100, a common electrode panel 200, and an LC layer 300 interposed between the panels 100 and 200 and containing a plurality of LC molecules 310 aligned substantially vertical to surfaces of the panels 100 and 200.

The TFT array panel 100 is now described in detail with reference to FIGS. 18, 19, and 21.

A plurality of gate lines 121 and a plurality of storage electrode lines 131 are formed on an insulating substrate 110 such as transparent glass.

The gate lines 121 extend substantially in a transverse direction. The gate lines 121 are separated from each other and transmit gate signals. Each gate line 121 includes a plurality of projections forming a plurality of gate electrodes 124.

Each storage electrode line 131 extends substantially in the transverse direction. Each storage electrode line 131 includes a plurality of sets of two longitudinal branches forming first and second storage electrodes 133a and 133b and oblique branches forming third and fourth storage electrodes 133c and 133d connected between the first storage electrode 133a and the second storage electrode 133b. Each of the first storage electrodes 133a has a free end portion and a fixed end portion connected to the storage electrode line 131. The free end portion of each of the first storage electrodes 133a includes a projection. The storage electrode lines 131 are supplied with a predetermined voltage such as a common voltage, which is also applied to a common electrode 270 on the common electrode panel 200 of the LCD. Each storage electrode line 131 may include a pair of stems extending in the transverse direction.

The gate lines 121 and the storage electrode lines 131 preferably comprise an Al-containing metal, an Ag-containing metal, a Cu-containing metal, a Mo-containing metal, Cr, Ti, or Ta.

In addition, the lateral sides of the gate lines 121 and the storage electrode lines 131 are inclined relative to a surface of the substrate, and the inclination angles thereof range from about 20 to 80 degrees.

A gate insulating layer 140 preferably comprising silicon nitride ($SiN_x$) is formed on the gate lines 121 and the storage electrode lines 131.

A plurality of semiconductor stripes 151 preferably comprising hydrogenated amorphous silicon (abbreviated to "a-Si") or polysilicon are formed on the gate insulating layer 140. Each semiconductor stripe 151 extends substantially in the longitudinal direction and has a plurality of projections 154 branching out toward the gate electrodes 124.

A plurality of ohmic contact stripes and islands 161 and 165 preferably comprising silicide or n+ hydrogenated a-Si heavily doped with an n-type impurity such as phosphorus are formed on the semiconductor stripes 151. Each ohmic contact stripe 161 includes a plurality of projections 163, and the projections 163 and the ohmic contact islands 165 are located in pairs on the projections 154 of the semiconductor stripes 151.

A plurality of diffusion barrier stripes 641 and islands 645 are formed on the ohmic contact stripes 161 and islands 165. The diffusion barrier stripes 641 and islands 645 preferably comprise silicide or n+ hydrogenated a-Si heavily doped with an n-type impurity and include nitrogen ($N_2$). Accordingly, the diffusion barrier stripes 641 and islands 645 comprise the same material as the ohmic contact stripes 161 and islands 165, with the addition of N. The diffusion barrier stripes 641 and islands 645 have the same planar pattern as the ohmic contact stripes 161 and islands 165.

The lateral sides of the semiconductor stripes 151, the ohmic contacts 161 and 165, and the diffusion barriers 641 and 645 are inclined relative to a surface of the substrate, and the inclination angles thereof are preferably in a range between about 30 and 80 degrees.

A plurality of data lines 171, a plurality of drain electrodes 175 separated from the data lines 171, and a plurality of isolated metal regions 172 are formed on the diffusion barriers 641 and 645 and the gate insulating layer 140.

The data lines 171 for transmitting data voltages extend substantially in the longitudinal direction and intersect the gate lines 121 to define pixel areas arranged in a matrix. A plurality of branches of each data line 171, which project toward the drain electrodes 175, form a plurality of source electrodes 173. Each pair of the source electrodes 173 and the drain electrodes 175 is separated from each other and opposite each other with respect to a gate electrode 124.

A gate electrode 124, a source electrode 173, and a drain electrode 175 along with a projection 154 of a semiconductor stripe 151 forms a TFT having a channel formed in the projection 154 disposed between the source electrode 173 and the drain electrode 175.

The metal regions 172 are disposed on the gate lines 121 near the end portions of the storage electrodes 133a.

The data line 171, the drain electrode 175, and the metal regions 172 comprise first layers 171a and 175a, second layers 171b and 175b, and third layers 171c and 175c, respectively. The first, second, and third layers forming the metal region 172 are not shown, but are substantially similar to the first layers 171a and 175a, the second layers 171b and 175b, and the third layers 171c and 175c forming the data lines 171 and the drain electrode 175. The first layers 171a and 175a and the third layers 171c and 175c are respectively disposed at lower and upper sides of the second layers 171b and 175b. The second layers 171b and 175b preferably comprise an Al-containing metal such as Al, which has low resistivity, to reduce signal delay and voltage drop. The first layers 171a and 175a preferably comprise a metal for preventing diffusion of Al such as Ti, Ta, Cr, Mo, and their alloys. The third layers 171c and 175c preferably comprise a metal having good physical, chemical, and electrical contact characteristics with IZO or ITO such as Ti, Ta, Cr, Mo, and their alloys.

In the present embodiment, the first and third layers 171a, 171c, 175a, and 175c comprise Mo and the second layers 171b and 175b comprise Al.

Like the gate lines 121 and the storage electrode lines 131, the data lines 171 and the drain electrodes 175 have tapered lateral sides, and the inclination angles thereof range from about 30 to 80 degrees.

The diffusion barrier stripes 641 and islands 645 and the ohmic contacts 161 and 165 are interposed between the semiconductor stripes 151 and the data lines 171 and between the drain electrodes 175 and the projections 154 of the semiconductor stripe 151. The diffusion barrier stripes 641 and islands 645 prevent metal particles of the data lines 171 and the drain electrodes 175 from diffusing into the semiconductor stripes 151. The diffusion barrier stripes 641 and islands 645 reduce contact resistance between the semiconductor stripes 151 and the data lines 171 and between the drain electrodes 175 and the projections 154 of the semiconductor stripe 151 along with the ohmic contacts 161 and 165. Here, the nitrogen in the diffusion barrier stripes 641 and islands 645 serves as an n-type impurity.

A passivation layer 180 is formed on the data lines 171, the drain electrodes 175, and the exposed portions of the semiconductor stripes 151. The passivation layer 180 preferably comprises a photosensitive organic material having a good flatness characteristic, a low dielectric insulating material having a dielectric constant lower than 4.0 such as a-Si:C:O and a-Si:O:F formed by plasma enhanced chemical vapor deposition (PECVD), or an inorganic material such as silicon nitride.

The passivation layer 180 comprises a plurality of contact holes 182 and 185 exposing the end portions of the data lines 171 and the end portions of the drain electrodes 175, respectively. The passivation layer 180 also comprises a plurality of contact holes 183 and 184 exposing portions of the storage electrode lines 131 near the fixed end portions of the first storage electrodes 133a and the projections of the free end portions of the first storage electrodes 133a, respectively. The contact holes 182-185 may be formed in the cross-sectional shape of polygon or a circle, with tapered sidewalls. Each of the contact holes 182 exposing the end portions preferably has an area ranging from about 0.5 mm×15μ to about 2 mm×60μ.

A plurality of pixel electrodes 190, a plurality of contact assistants 82, and a plurality of overpasses 194, which preferably comprise ITO or IZO, are formed on the passivation layer 180.

The pixel electrodes 190 are physically and electrically connected to the drain electrodes 175 through the contact holes 185 such that the pixel electrodes 190 receive the data voltages from the drain electrodes 175. The pixel electrodes 190 overlap the storage electrode lines 131 including the storage electrodes 133a-133c to form storage capacitors.

Each pixel electrode 190 is chamfered at its left corners and the chamfered edges of the pixel electrode 190 form an angle of about 45 degrees with the gate lines 121.

Each pixel electrode 190 includes a center cutout 192, a lower cutout 191, and an upper cutout 193, which partition the pixel electrode 190 into a plurality of partitions.

The lower and the upper cutouts 191 and 193 obliquely extend approximately from a right edge of the pixel electrode 190 approximately to a left edge of the pixel electrode 190 (as shown in FIG. 19). The center cutout 192 divides the pixel electrode 190 into lower and upper halves, and the lower and upper cutouts 191 and 193 are disposed in the lower and upper halves, respectively. The lower and the upper cutouts 191 and 193 form an angle of about 45 degrees to the gate lines 121, and extend perpendicular to each other.

As shown in FIG. 19, the center cutout 192 includes an inlet from the right edge of the pixel electrode 190 and a pair of inclined edges substantially parallel to the lower cutout 191 and the upper cutout 193, respectively.

Accordingly, the lower half of the pixel electrode 190 is partitioned into two lower partitions by the lower cutout 191, and the upper half of the pixel electrode 190 is partitioned into two upper partitions by the upper cutout 193. The number of partitions or the number of the cutouts may vary depending on design factors, such as the size of pixels, the ratio of the transverse edges and the longitudinal edges of the pixel electrodes, the type and characteristics of the liquid crystal layer 300, and so on.

The contact assistants 82 are coupled to the end portions of the data lines 171 through the contact holes 182. The contact assistants 82 protect the end portions and complement the adhesion between the end portions and external devices.

The overpasses 194 cross over the gate lines 121, and are coupled to the exposed portions of the storage electrode lines 131 and the exposed projection of the fixed end portions of the first storage electrodes 133a, respectively, through the contact holes 183 and 184 opposite each other with respect to the gate lines 121. The overpasses 194 overlap the metal regions 172, and may be electrically connected to the metal regions 172. The storage electrode lines 131 including the storage electrodes 133a-133d along with the overpasses 194 and the metal regions 172 are used for repairing defects in the gate lines 121, the data lines 171, or the TFTs. The electrical connection between the gate lines 121 and the storage electrode lines 131 for repairing the gate lines 121 is obtained by illuminating the cross points of the gate lines 121 and the overpasses 194 by a laser beam to electrically connect the gate lines 121 to the overpasses 194. In this case, the metal regions 172 enhance the electrical connection between the gate lines 121 and the overpasses 194.

The description of the common electrode panel 200 follows with reference to FIGS. 19, 20, and 21.

A light blocking member 220 is formed on an insulating substrate 210 such as transparent glass. The light blocking member 220 may include a plurality of openings that expose the pixel electrodes 190, and may have substantially the same shape as the pixel electrodes 190. Otherwise, the light blocking member 220 may include linear portions corresponding to the data lines 171 and other portions corresponding to the TFTs.

A plurality of color filters 230 are formed on the substrate 210, and are disposed substantially in the areas enclosed by the light blocking member 220. The color filters 230 may extend substantially in the longitudinal direction opposite the pixel electrodes 190. The color filters 230 may represent one of the primary colors such as red, green, and blue colors.

An overcoat 250 is formed on the color filters 230.

A common electrode 270 preferably comprising a transparent conductive material such as ITO and IZO is formed on the overcoat 250.

The common electrode 270 has a plurality of sets of cutouts 272, 271, and 273.

A set of cutouts 272, 271, and 273 face a pixel electrode 190 and include a center cutout 272, a lower cutout 271, and an upper cutout 273. Each of the cutouts 272, 271, and 273 is disposed between adjacent cutouts 192, 191, and 193 of the pixel electrode 190 or between a cutout 191 or 193 and a chamfered edge of the pixel electrode 190. In addition, each of the cutouts 272, 271, and 273 has at least an oblique portion extending parallel to the lower cutout 191 or the upper cutout 193 of the pixel electrode 190. The cutouts 272, 271, and 273 substantially have inversion symmetry with respect to a third storage electrode 133c.

Each of the lower and upper cutouts 271 and 273 includes an oblique portion extending approximately from a left edge of the pixel electrode 190 approximately to a lower or upper edge of the pixel electrode 190, and transverse and longitudinal portions extending from respective ends of the oblique portion along edges of the pixel electrode 190, overlapping the edges of the pixel electrode 190, and forming obtuse angles with the oblique portion.

The center cutout 272 includes a central transverse portion extending approximately from the left edge of the pixel electrode 190 to the center of a pixel, a pair of oblique portions extending from an end of the central transverse portion approximately to a right edge of the pixel electrode and forming obtuse angles with the central transverse portion, and a pair of terminal longitudinal portions extending from the ends of the respective oblique portions along the right edge of the pixel electrode 190, overlapping the right edge of the pixel electrode 190, and forming obtuse angles with the respective oblique portions.

The number of the cutouts 272, 271, and 273 may be varied depending on the design factors, and the light blocking member 220 may also overlap the cutouts 272, 271, and 273 to block the light leakage through the cutouts 272, 271, and 273.

Homeotropic alignment layers 11 and 21 are coated on inner surfaces of the panels 100 and 200, respectively, and polarizers 12 and 22 are provided on outer surfaces of the panels 100 and 200, respectively, such that their polarization axes may be crossed and one of the transmissive axes may be parallel to the gate lines 121. One of the polarizers may be omitted when the LCD is a reflective LCD.

The LCD may further include at least one retardation film for compensating the retardation of the LC layer 300.

The LC molecules 310 in the LC layer 300 are aligned such that their long axes are vertical to the surfaces of the panels 100 and 200. The liquid crystal layer 3 has negative dielectric anisotropy.

The cutouts 192, 191, 193, 272, 271, and 273 control the tilt directions of the LC molecules in the LC layer 300. That is, the liquid crystal molecules in each region called a domain are defined by adjacent cutouts 192, 191, 193, 272, 271, and 273 or by the cutout 271 or 273. The chamfered edge of the pixel electrode 190 is tilted in a direction perpendicular to the extension direction of the cutouts 192, 191, 193, 272, 271, and 273. It is apparent that the domains have two long edges extending substantially parallel to each other and forming an angle of about 45 degrees with the gate line 121.

The width of the cutouts 192, 191, 193, 272, 271, and 273 is preferably in a range between about nine microns to about twelve microns.

At least one of the cutouts 192, 191, 193, 272, 271, and 273 can be substituted with protrusions (not shown) or depressions (not shown). The protrusions preferably comprise an organic or inorganic material and are disposed on or under the field-generating electrodes 190 or 270 and have a width of about five microns to about ten microns.

The distance between an edge of a cutout 192, 191, or 193 and an edge of a cutout 272, 271, or 273 adjacent to the edge of the cutout 192, 191, or 193 and the distance between a chamfered edge of a pixel electrode 190 and an edge of a cutout 272, 271, or 273 adjacent to the edge of the cutout 192, 191, or 193 are preferably in a range between about twelve microns to about twenty microns, more preferably between about seventeen microns to about nineteen microns. This range can increase the response time of the liquid crystal to obtain a desired transmittance while decreasing the aperture ratio.

The shapes and the arrangements of the cutouts 192, 191, 193, 272, 271, and 273 may be modified.

In the present invention, by forming the diffusion barriers containing nitrogen between the semiconductor and the metal layer, diffusion of metal particles toward the semiconductor may be prevented. Accordingly, current leakage may be minimized.

While the present invention has been described in detail with reference to the preferred embodiments, those skilled in the art will appreciate that various modifications and substitutions can be made thereto without departing from the spirit and scope of the present invention as set forth in the appended claims.

The invention claimed is:

1. A manufacturing method of a thin film transistor array panel, comprising:
   forming a gate line on an insulating substrate;
   depositing a gate insulating layer and a first a-Si layer in sequence;
   depositing a second a-Si layer doped with a conductive impurity on the first a-Si layer and a third a-Si layer including nitrogen on the second a-Si layer;
   patterning the third a-Si layer, the second a-Si layer, and the first a-Si layer to form a pre-diffusion barrier, pre-ohmic contacts, and a semiconductor layer, respectively;
   forming a data line and a drain electrode partially overlapping the pre-diffusion barrier;
   etching the pre-diffusion barrier and the pre-ohmic contacts disposed between the data line and the drain electrode to form diffusion barriers and ohmic contacts, respectively; and
   forming a pixel electrode electrically connected to the drain electrode.

2. The method of claim 1, wherein the data line and the drain electrode comprise first to third conductor layers, the first and third conductor layers comprising Mo or a Mo alloy, and the second layer comprising Al or an Al alloy.

3. The method of claim 1, wherein the third a-Si layer is deposited in a same environment as the second a-Si layer except that the third a-Si layer is deposited in an environment that includes a gas containing nitrogen.

4. The method of claim 3, wherein the gas containing nitrogen is one of $N_2$, $NH_3$, and a mixture of $N_2$ and $NH_3$.

5. The method of claim 1, further comprising forming color filters before forming the pixel electrode.

\* \* \* \* \*